(12) United States Patent
Sato et al.

(10) Patent No.: US 8,072,732 B2
(45) Date of Patent: Dec. 6, 2011

(54) CAPACITOR AND WIRING BOARD INCLUDING THE CAPACITOR

(75) Inventors: Motohiko Sato, Aichi (JP); Kenji Murakami, Gifu (JP); Jun Otsuka, Aichi (JP); Manabu Sato, Aichi (JP); Masahiko Okuyama, Aichi (JP); Kozo Yamazaki, Gifu (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 909 days.

(21) Appl. No.: 12/100,527

(22) Filed: Apr. 10, 2008

(65) Prior Publication Data
US 2008/0251285 A1    Oct. 16, 2008

(30) Foreign Application Priority Data

Apr. 10, 2007 (JP) ................. 2007-102471
Jan. 18, 2008 (JP) ................. 2008-008715

(51) Int. Cl.
*H01G 4/005* (2006.01)

(52) U.S. Cl. ...... 361/303; 174/260; 174/261; 361/298.2; 361/298.3; 361/298.4; 361/298.5; 361/299.1; 361/299.2; 361/299.3; 361/299.4; 361/299.5; 361/301.1; 361/301.3; 361/311

(58) Field of Classification Search .... 361/298.2–298.5, 361/299.1–299.5, 301.1, 301.3, 761, 763, 361/303, 311; 174/260, 261
See application file for complete search history.

(56) References Cited

U.S. PATENT DOCUMENTS

| | | | | |
|---|---|---|---|---|
| 5,835,338 A | * | 11/1998 | Suzuki et al. | 361/301.4 |
| 6,979,890 B2 | | 12/2005 | Kambe et al. | |
| 7,002,075 B2 | | 2/2006 | Kambe et al. | |
| 7,394,643 B2 | * | 7/2008 | Yamane et al. | 361/303 |
| 2006/0039097 A1 | * | 2/2006 | Satou | 361/303 |
| 2006/0215350 A1 | | 9/2006 | Tonogai et al. | |
| 2006/0244134 A1 | * | 11/2006 | Inagaki et al. | 257/734 |
| 2007/0030628 A1 | * | 2/2007 | Yamamoto et al. | 361/311 |
| 2007/0045815 A1 | * | 3/2007 | Urashima et al. | 257/698 |
| 2007/0047175 A1 | * | 3/2007 | Sato et al. | 361/303 |
| 2007/0121273 A1 | * | 5/2007 | Yamamoto et al. | 361/306.2 |
| 2007/0121275 A1 | * | 5/2007 | Takashima et al. | 361/311 |

FOREIGN PATENT DOCUMENTS

JP      2006324576      11/2006

* cited by examiner

*Primary Examiner* — Hung S Bui
*Assistant Examiner* — James Wu
(74) *Attorney, Agent, or Firm* — Stites & Harbison, PLLC; Jeffrey A. Haeberlin

(57) ABSTRACT

A capacitor is provided having a tough surface portion which prevents cracking that tends to occur when the capacitor is built-in or surface-mounted on a wiring board. A ceramic sintered body of the capacitor includes a capacitor forming layer portion, a cover layer portion and an interlayer portion. The capacitor forming layer portion has a laminated structure wherein ceramic dielectric layers and inner electrodes connected to a peripheral portion of capacitor via conductors, are alternately laminated. The cover layer portion is exposed at a surface portion of the ceramic body and has a laminated structure wherein ceramic dielectric layers and dummy electrodes not connected to the capacitor via conductors, are alternately laminated.

17 Claims, 17 Drawing Sheets

CAPACITOR AND WIRING BOARD INCLUDING THE CAPACITOR

FIELD OF THE INVENTION

The present invention relates to a capacitor adapted to be embedded in a wiring board or to be surface-mounted on a wiring board, and to a wiring board in which the capacitor is embedded therein or surface-mounted thereon.

BACKGROUND OF THE INVENTION

With recent enhancements in the speed and performance of semiconductor integrated circuit devices (IC chips) used in microprocessors of computers and the like, the number of terminals tends to increase, and the pitch between terminals tends to decrease accordingly. In general, a plurality of terminals is densely arranged in an array on the bottom surface of an IC chip and the terminal group is connected to the terminal group of a motherboard in a "flip chip" manner. However, since the terminal group of the IC chip and the terminal group of the motherboard are substantially different to each other with respect to the pitch between the terminals, a method for manufacturing a package in which the IC chip is mounted on an IC chip mounting circuit board and the package is mounted on the motherboard is employed. In a wiring board constituting such a package, it is proposed to employ a built-in capacitor in order to reduce the switching noise of the IC chip or the like. As an example of such a wiring board, a wiring board in which a capacitor is accommodated in an accommodation hole of a core board made of polymer material, and a buildup layer is formed on top and rear surfaces of the core board is disclosed in, e.g., Japanese Patent Application Laid-Open (kokai) No. 2005-39243.

More particularly, the wiring board according to the above-identified application has an accommodation hole that opens at an upper surface and a lower surface in the center of a core board, and a via array type ceramic capacitor is accommodated in the accommodation hole.

FIG. 15 shows an example of a conventional (prior art) via array type ceramic capacitor 201. This ceramic capacitor 201 is comprised of a capacitor forming layer portion 202, a cover layer portion 203 and an interlayer portion 204. The capacitor forming layer portion 202 has a laminated structure in which a plurality of first inner electrodes 206 and a plurality of second inner electrodes 207 are each alternately laminated by sandwiching a ceramic dielectric layer 205 therebetween. The ceramic dielectric layer 205 is made of a sintered body of barium titanate, which is a high dielectric constant ceramic, and functions as a dielectric (insulator) between the first inner electrode 206 and the second inner electrode 207.

The interlayer portion 204 is comprised of a plurality of laminated ceramic dielectric layers 208, and is arranged between the capacitor forming layer portions 202. In the capacitor forming layer portion 202, there is a portion where the first inner electrode 206 overlaps the second inner electrode 207 in a thickness direction, and a portion where the first inner electrode 206 does not overlap the second inner electrode 207. Thus, although there is a difference in thickness (due to the formation of electrodes) in the capacitor forming layer portion 202 due to formation of the inner electrodes 206, 207, the difference in thickness can be compensated by providing the interlayer portion 204 between the capacitor forming layer portions 202.

Similar to the interlayer portion 204, the cover layer portion 203 has a structure in which a plurality of ceramic dielectric layers 209 is laminated and disposed on a surface portion of the capacitor 201 so as to cover the capacitor forming layer portion 202. By forming the cover layer portion 203, the insulation, heat resistance, moisture resistance and the like of the capacitor 201 are maintained.

A plurality of via holes 210 is formed in the ceramic capacitor 201. These via holes 210 penetrate the capacitor 201 in the thickness direction, i.e., extend transversely of capacitor 201 rather than extending longitudinally, and are disposed in a lattice pattern (i.e., in the form of array) over the whole surface of the capacitor 201. First and second via conductors are indicated at 211 and 212, and a via conductor (211 or 212) penetrating between an upper surface and a lower surface of the capacitor 201 is formed in each via hole 210. Each first via conductor 211 penetrates each first inner electrode 206 so that the first inner electrodes 206 are electrically connected to each other. Each second via conductor 212 penetrates each second inner electrode 207 so that the second inner electrodes 207 are electrically connected to each other.

The thus-constituted ceramic capacitor 201 is produced, for example, using the following procedures. First, a nickel paste for the inner electrode is screen-printed to a ceramic green sheet and is allowed to dry. Then, a plurality of green sheets is laminated and compressed in a laminate direction to integrate each green sheet whereby a green sheet laminated body is formed. Further, a plurality of via holes 210 is formed in the green sheet laminated body, and a nickel paste for via conductor is filled in each via hole 210. Thereafter, the green sheet laminated body is degreased and fired at a predetermined temperature for a predetermined period to thereby complete the ceramic capacitor 201.

As disclosed in the above-identified application, the ceramic capacitor 201 in FIG. 15 is used as a built-in capacitor. However, it can also be used as a surface-mounted capacitor on a wiring board.

When a conventional ceramic capacitor 201 shown in FIG. 15 is built in to a wiring board as disclosed in the above-identified application, it has been confirmed that a Vickers examination indicates a residual stress remaining near the surface of the capacitor 201. That is, when a compression stress is applied to in a first direction (i.e., a XY direction) perpendicular to a thickness direction (the Z direction) of the capacitor 201, a tensile stress is exerted in the thickness direction. When embedding the ceramic capacitor 201 in the wiring board, the ceramic capacitor 201 is pulled in the Z direction due to contraction of a buildup layer formed on the cover layer portion 203. The cover layer portion 203 of the ceramic capacitor 201 is only comprised of ceramic dielectric layers 209 and has a relatively low toughness, i.e., is relatively weak. Thus, a crack 215 (refer to FIG. 16) is generated or produced near each via conductor 211, 212 in the cover layer portion 203. As a result, the reliability of the wiring board deteriorates.

Further, as shown in FIG. 17, when the ceramic capacitor 201 is surface-mounted on a wiring board 220 by a flip-chip method, compression stress (i.e., stress in X and Y directions) is produced near the surface of the ceramic capacitor 201 due to a difference in thermal expansion between the wiring board 220 and the ceramic capacitor 201. Therefore, the ceramic capacitor 201 is cambered or bowed, and cracking is likely to occur in the cover layer portion 203.

More particularly, as shown in FIG. 18, when a cambered ceramic capacitor 201 is surface-mounted on the wiring board 220, a further large stress is produced near the surface of the ceramic capacitor 201. As a result, the ceramic capacitor 201 is likely to deform, and there is a high possibility of cracking occurring in the ceramic capacitor 201.

Further, as shown in FIG. 19, when the ceramic capacitor 201 is surface-mounted on the wiring board 220 and a gap between the wiring board 220 and the ceramic capacitor 201 is sealed by an underfill material 230, a tensile stress (in the direction Z) due to a thermosetting contraction of the underfill material 230 is exerted on the ceramic capacitor 201. As a result, cracking is likely to occur in the cover layer portion 203 of the ceramic capacitor 201.

SUMMARY OF THE INVENTION

The present invention addresses and seeks to solve the above-mentioned problems, and one object of the present invention is to provide a capacitor which has a tough surface portion and which prevents a cracking that tends to occur when the capacitor is built-in or surface-mounted on a wiring board.

In accordance with a first aspect of the invention, there is provided a capacitor comprising: a plate-like capacitor main body having a thickness direction and including a capacitor main surface and a capacitor rear surface; and a plurality of capacitor via conductors provided in the capacitor main body and extending in the thickness direction, wherein the capacitor main body is comprised of: a first dielectric laminated portion having a laminated structure in which a plurality of first dielectric layers and a plurality of inner electrodes connected to a peripheral portion of the plurality of capacitor via conductors are alternately laminated; and a second dielectric laminated portion having a laminated structure in which a plurality of second dielectric layers and a plurality of dummy electrodes unconnected to the peripheral portion of the plurality of capacitor via conductors are alternately laminated, and disposed so as to be exposed at a surface portion of the capacitor main body.

In the capacitor according to the first aspect of the invention, the second dielectric laminated portion is provided in the surface portion of the capacitor main body and the dummy electrodes are each disposed between the plurality of second dielectric layers. The dummy electrodes are each preferably a large-sized electrode. Further, in one preferred implementation, the dummy electrodes are of a solid configuration formed around an associated capacitor via conductor with a predetermined clearance therebetween. In this way, the toughness of the surface portion of the capacitor main body can be improved. Therefore, when any external stress is exerted on the capacitor surface at the time of accommodating the capacitor in the wiring board, any cracking near the capacitor via conductor in the surface portion can be prevented.

The thickness of the second dielectric layer is preferably greater than that of the first dielectric layer. In this way, the characteristics of the second dielectric laminated portion such as structural integrity can be fully maintained.

In another preferred implementation, the thickness of the second dielectric layer is equal to that of the first dielectric layer. In this way, these dielectric layers can each be made of sheet materials having the same thickness, thereby contributing to cost-effective manufacturing of the layers.

The dummy electrodes are preferably made of the same metal material as that of the plurality of inner electrodes. By forming the dummy electrodes using the same metal material as that of the inner electrodes, it is not necessary to employ a different metal material for forming the dummy electrodes. Further, the plurality of inner electrodes and the dummy electrodes can be simultaneously fired under the same conditions (e.g., with the same firing temperature and for the same time period), thereby achieving cost-effective manufacturing.

The thickness of the dummy electrode or electrodes is preferably equal to or greater than that of the plurality of inner electrodes. In this way, the characteristics of the second dielectric laminated portion can be fully maintained, and cracking near the capacitor via conductor in the second dielectric laminated portion is reliably prevented.

A plurality of second land-shaped conductors connected to the peripheral portion of the plurality of capacitor via conductors are preferably formed in a common layer with the dummy electrode of the second dielectric laminated portion. By forming the plurality of second land-shaped conductor in the same layer as the layer in which the dummy electrode of the second dielectric laminated portion is formed, a difference in thickness (due to the formation of the electrode) is produced between a portion containing the dummy electrode and a portion containing no dummy electrode, as viewed in the thickness direction of the second dielectric laminated portion. However, the second land-shaped conductor can reliably compensate this difference in thickness, and thus it is possible to further prevent the occurrence of cracking.

In a further preferred embodiment, the capacitor includes a third dielectric laminated portion disposed between the first dielectric laminated portions and having a laminated structure in which a plurality of third dielectric layers and the plurality of third land-shaped conductors connected to the peripheral portion of the plurality of capacitor via conductors are alternately disposed or laminated. By laminating the plurality of first dielectric layers and the plurality of inner electrodes in the first dielectric laminated portion, a difference in thickness (due to the formation of the electrodes) is produced between a portion where the electrodes overlap each other in the thickness direction and a portion where there is no electrode overlap. However, since the plurality of third land-shaped conductors is laminated around the peripheral portion of the capacitor via conductors in the third dielectric laminated portion, the difference in thickness can be reliably compensated, thereby preventing the occurrence of cracking.

The thickness of the third dielectric layer is preferably greater than that of the first dielectric layer. In this way, the characteristics of the third dielectric laminated portion can be fully maintained.

In another important implementation, the thickness of the third dielectric layer is equal to that of the first dielectric layer. In this way, the dielectric layers can both be made of sheet materials having the same thickness, thereby contributing to cost-effective manufacturing of the layers.

The second land-shaped conductors and the third land-shaped conductors are preferably made of the same metal material as that of the plurality of inner electrodes. By forming the second and third land-shaped conductors using the same metal material as that of the inner electrodes, it is not necessary to employ a different metal material in forming the land-shaped conductors. Further, the plurality of inner electrodes and the land-shaped conductors can be simultaneously fired under the same conditions (i.e., at the firing temperature and for the same time period), thereby achieving cost-effective manufacturing.

The thickness of the second land-shaped conductor and the thickness of the third land-shaped conductor are preferably equal to or greater than that of the plurality of inner electrodes. In this way, the characteristics of the third dielectric laminated portion can be fully maintained, and a cracking near the capacitor via conductor in the third dielectric laminated portion can be reliably prevented.

The capacitor is preferably disposed on the capacitor main surface and preferably has a plurality of terminal electrodes connected at least to a capacitor main surface side end portion of the plurality of capacitor via conductors. In this way, the terminal electrode allows reliable connection to the conductors in the wiring board.

As a material of the first dielectric layer, the second dielectric layer and the third dielectric layer, good candidates include a ceramic dielectric layer, a resin dielectric layer and a dielectric layer made of ceramic-resin compound material or the like.

Sintered bodies of high temperature sintered ceramics, such as alumina, aluminum nitride, boron nitride, silicon carbide and silicon nitride are suitably used as a ceramic dielectric layer. In addition, sintered bodies of low-temperature sintered ceramics, such as a glass ceramic in which an inorganic ceramic filler such as alumina is added to borosilicate glass or borosilicate lead glass, are also suitable. In this case, it is also preferred to use a sintered body of a dielectric ceramic, such as barium titanate, lead titanate and strontium titanate, depending on the application. In the case where the sintered body of the dielectric ceramic is used, a capacitor having a large electrostatic capacity becomes easily realizable.

As a resin dielectric layer, an epoxy resin and a tetrafluoroethylene resin (PTFE) containing adhesives are, among others, suitable. Further, in the case of a dielectric layer comprised of ceramic-resin compound material, barium titanate, lead titanate, strontium titanate and the like are suitably used as a ceramic material, and a thermosetting resin, such as epoxy resin, phenol resin, urethane resin, silicone resin, polyimide resin or unsaturated polyester; a thermoplastic resin, such as polycarbonate resin, acrylic resin, polyacetal resin or polypropylene resin; and a latex, such as nitrile-butadiene rubber, styrene-butadiene rubber or fluoride rubber, are suitable for use as a resin material.

Although the forms or manner of implementation of the inner electrode, the capacitor via conductor, the terminal electrode, the dummy electrode, the second and third land-shaped conductors are not limited to a particular for or implementation, a metallized conductor is preferable when the dielectric layer is, for example, a ceramic dielectric layer. The metallized conductor is formed in such a manner that a conductive paste containing metallic powder is applied by a conventionally known method, such as a metallize printing, and the thus-printed paste is thereafter fired. When forming the metallized conductor and the ceramic dielectric layer with a simultaneous firing method, the metallic powder in the metallized conductor is required to have a higher melting point than the firing temperature of the ceramic dielectric layer. For example, when the ceramic dielectric layer is comprised of a so-called high temperature sintered ceramic (e.g., alumina or the like), nickel (Ni), tungsten (W), molybdenum (Mo), manganese (Mn), or an alloy containing any one of these materials may be selected as metallic powder contained in the metallized conductor. When the ceramic dielectric layer comprised of a so-called low-temperature sintered ceramic (e.g., glass ceramic or the like), copper (Cu), silver (Ag) or the like, or an alloy containing one of these materials, may be selected as metallic powder contained in the metallized conductor.

In accordance with a second aspect of the invention, there is provided a wiring board in which the capacitor according to the first aspect of the invention is embedded.

According to the wiring board of the second aspect of the invention, because the toughness of the capacitor near the surface of the capacitor main body is fully maintained, it is possible to prevent cracking occurring near the surface of the capacitor main body even when an external stress is imposed during a fixation process for the capacitor. As a result, the reliability of the wiring board is improved.

The wiring board is preferably comprised of: a core board having an accommodation hole in which the capacitor according to the first aspect of the invention is accommodated; and a buildup layer formed on both the upper surface and the lower surface of the core board. The material used for forming the core board is not limited to a particular material. However, a preferred core board is made of a polymer material as a principal constituent. As specific examples of the polymer material used in forming the core board, it is possible to cite, for example, EP resin (epoxy resin), PI resin (polyimide resin), BT resin (bismaleimide triazine resin), PPE resin (polyphenylene ether resin) or the like. In addition, it is possible to use a composite material made of these resins and glass fibers (e.g., glass woven fabrics and nonwoven glass fabrics) or organic fibers, such as polyamide fibers.

In accordance with a third aspect of the invention, there is provided a wiring board having a substrate main surface on which the capacitor according to the first aspect of the invention is surface-mounted using a flip-chip method.

According to the wiring board of the third aspect of the invention, because the toughness near the surface of the capacitor main body is fully maintained, it is possible to prevent cracking from occurring near the surface of the capacitor main body even when a compression stress is imposed during surface-mounting of the capacitor. As a result, the reliability of wiring board is improved.

In the above-mentioned wiring board, a gap between the substrate main surface and the capacitor may be sealed with a resin material. With this approach, it is possible to prevent cracking from occurring near the surface of the capacitor main body even when a tensile stress is imposed on the capacitor due to curing contraction of the resin material during the sealing process.

Further features and advantages of the present invention will be set forth in, or apparent from, the detailed description of preferred embodiments thereof which follows.

FIRST EMBODIMENT

Hereinafter, a first embodiment carrying out the present invention will be described in detail with reference to the drawings.

Figure 1:
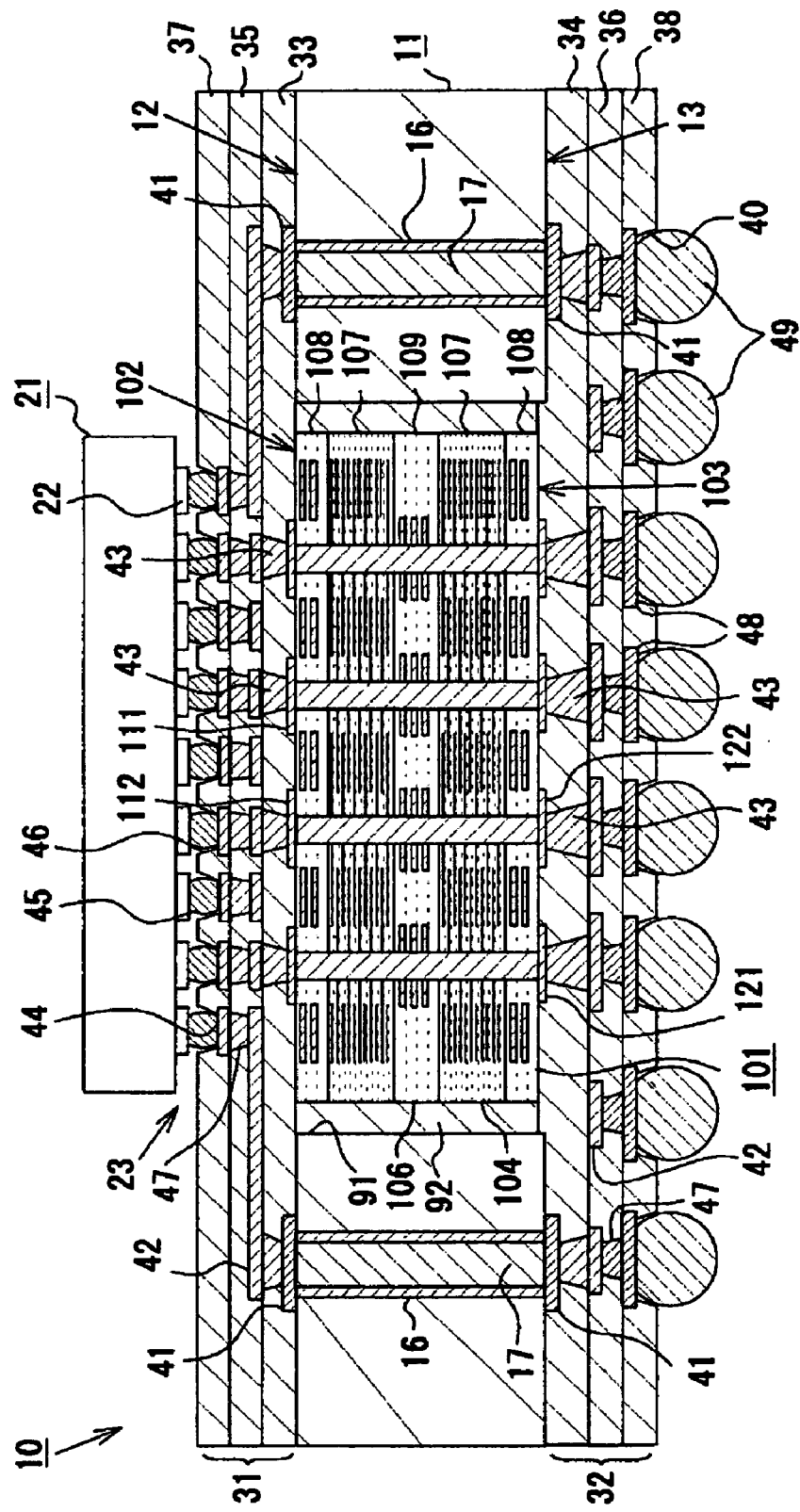
FIG. 1 is a schematic cross sectional view showing a wiring board according to a first embodiment according of the present invention.

As shown in FIG. 1, a wiring board 10 according to the first embodiment is a wiring board for mounting an IC chip. The wiring board 10 is comprised of a rectangle plate-like core board 11, a first buildup layer 31 formed on an upper surface of the core board 11 and a second buildup layer 32 formed on a lower surface of the core board 11.

The core board 11 according to the first embodiment is of a generally rectangular plate-like shape as seen from the plane view. Exemplary dimensions are 25.0 mm long×25.0 mm wide×1.0 mm thick. The core board 11 includes a plurality of through hole conductors 16 which penetrates the core main surface 12 and the core rear surface 13 so as to provide an electrical connection therebetween. It is noted that the inside of the through hole conductor 16 is filled up with a plugging body 17, such as an epoxy resin. Further, copper-made conductors 41 are formed on the core main surface 12 and the core rear surface 13 of the core board 11 so as to be electrically connected to the through hole conductors 16.

The first buildup layer 31 formed on the core main surface 12 of the core board 11 has a laminated structure in which two resin insulating layers 33 and 35 made of thermosetting resin (e.g., epoxy resin) and a conductor 42 made of copper are alternately laminated. Via conductors 43 are formed in plural locations in the second resin insulating layer 35. Terminal pads 44 are formed in plural locations on the surface of the second resin insulating layer 35 in the form of array. Further, the surface of the resin insulating layer 35 is entirely covered with a solder resist 37. Opening portions 46 to which the terminal pads 44 are exposed are formed on predetermined locations of the solder resist 37.

A plurality of solder bumps 45 is disposed on the respective surfaces of the terminal pad 44. Each solder bump 45 is electrically connected to a surface connection terminal 22 of a rectangular plate-like IC chip 21.

In addition, a region comprised of each terminal pad 44 and each solder bump 45 serves as an IC-chip mounting region 23 for mounting the IC chip 21. The IC-chip mounting region 23 is formed on a surface of the first buildup layer 31. Further, the resin insulating layers 33, 35 include via conductors 43, 47, respectively, so as to electrically connect the conductors 42 to the terminal pads 44.

As shown in FIG. 1, the second buildup layer 32 formed on the core rear surface 13 of the core board 11 is substantially identical to that of the first buildup layer 31. That is, the second buildup layer 32 has a laminated structure in which two resin insulating layers 34 and 36 made of thermosetting resin (e.g., epoxy resin) and the conductor layer 42 are alternately laminated. BGA pads 48 electrically connected to the conductor 42 through the via conductors 47 are formed in an array-shape on the lower surface of the resin insulating layer 36. Further, the lower surface of the resin insulating layer 36 is almost entirely covered with a solder resist 38. Opening portions 40 to which the BGA pads 48 are exposed are formed in the predetermined locations of the solder resist 38. A plurality of solder bumps 49 for electrically connecting to a motherboard (not illustrated) is disposed on the surfaces of the BGA pads 48. The wiring board 10 is mounted on a motherboard (not illustrated) through each solder bump 49.

The core board 11 includes a rectangular-shaped accommodation hole 91, as viewed in plan, which opens at both center portions of the core main surface 12 and the core rear surface 13. In other words, the accommodation hole 91 is a through-hole. In the accommodation hole 91, a ceramic capacitor 101 (capacitor to be built-in a wiring board) is embedded therein. The ceramic capacitor 101 in the first embodiment assumes a rectangular plate-like shape. Exemplary dimensions are 10.0 mm long×10.0 mm wide×0.8 mm thick. A gap between an inner face of the accommodation hole 91 and a capacitor side face 106 of the ceramic capacitor 101 is filled with a filler 92 preferably made of a polymer material (a thermosetting resin in this embodiment). The filler 92 fixes the ceramic capacitor 101 to the core board 11 and also functions to absorb deformation of the ceramic capacitor 101 and/or the core board 11 by the elastic deformation thereof in the planar direction and/or the thickness direction.

In the core board 11, the ceramic capacitor 101 is disposed in a region immediately below the IC-chip mounting area 23. The dimensions of the IC-chip mounting area 23 (an area of the region where the surface connection terminals 22 of the IC-chip are formed on) are made smaller than those of a capacitor main surface 102 of the ceramic capacitor 101. Thus, the IC-chip mounting area 23, as viewed in the thicknesswise direction of the ceramic capacitor 101, is disposed within the capacitor surface 102 of the ceramic capacitor 101.

Figure 2:
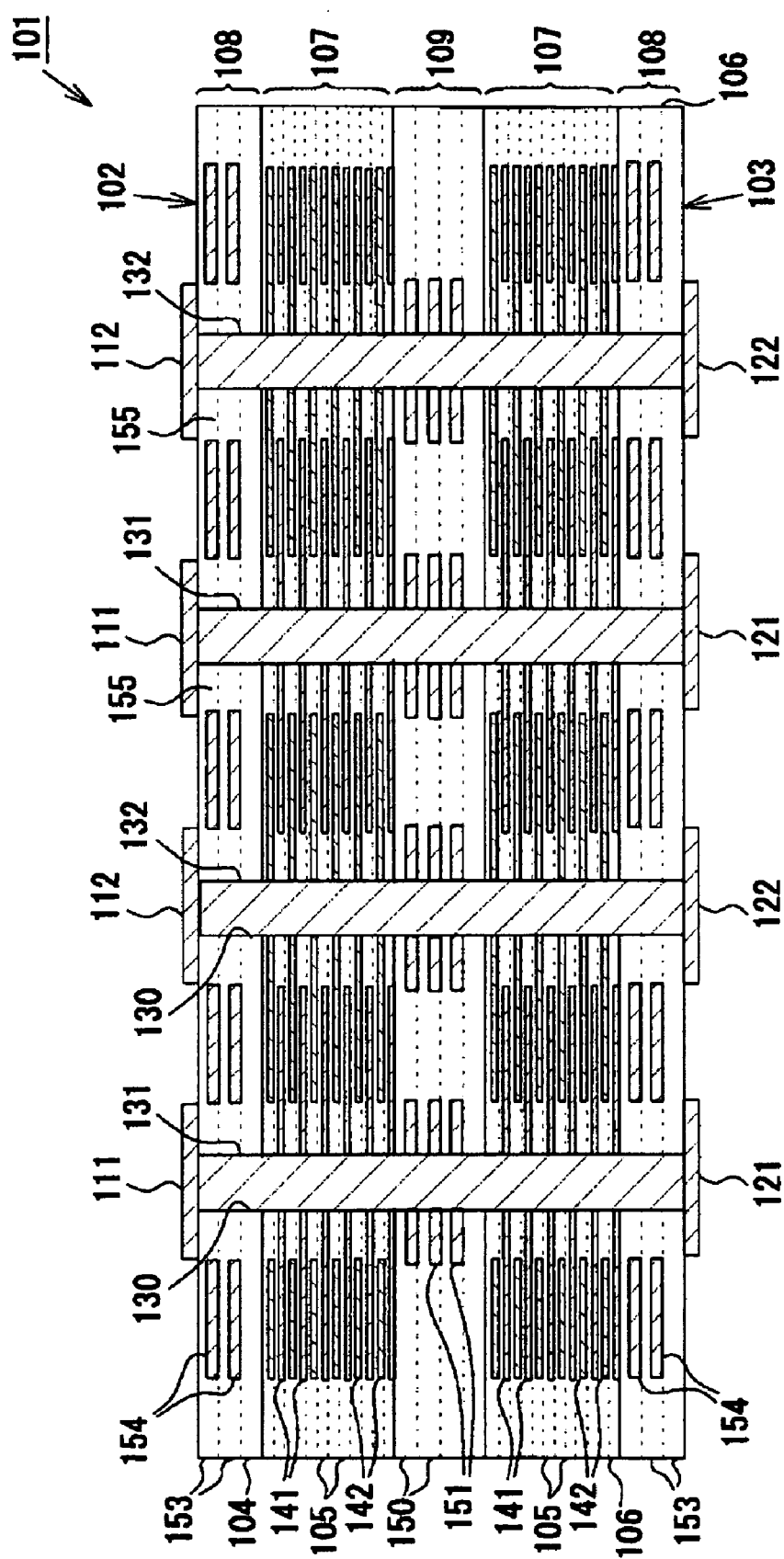
FIG. 2 is a schematic cross sectional view showing a ceramic capacitor according to a first embodiment.
Figure 3:
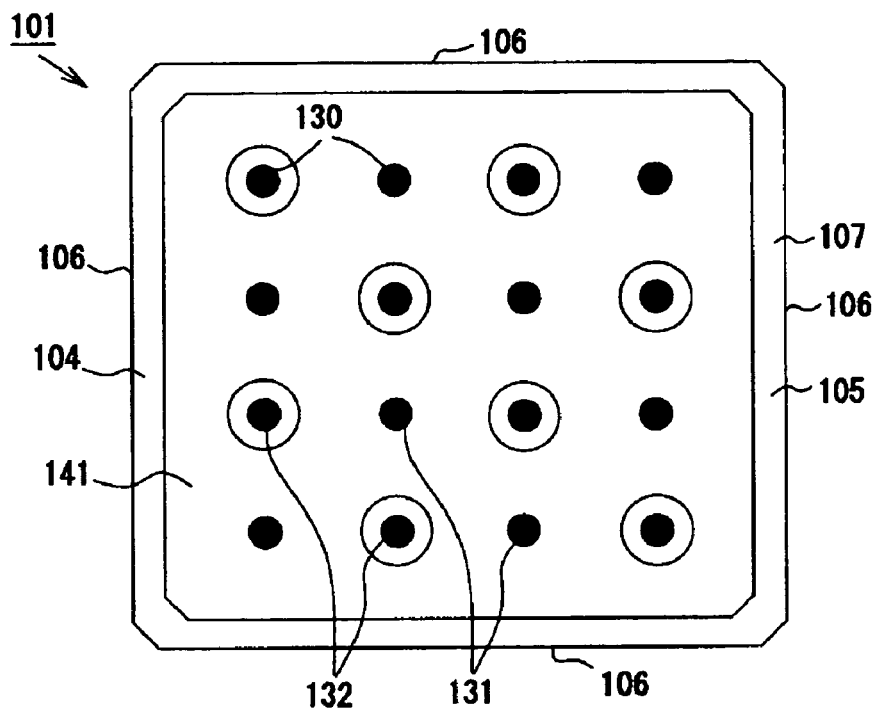
FIG. 3 is a schematic explanatory view used in explaining the connection between an inner electrode and a capacitor via conductor in a capacitor forming layer portion.
Figure 4:
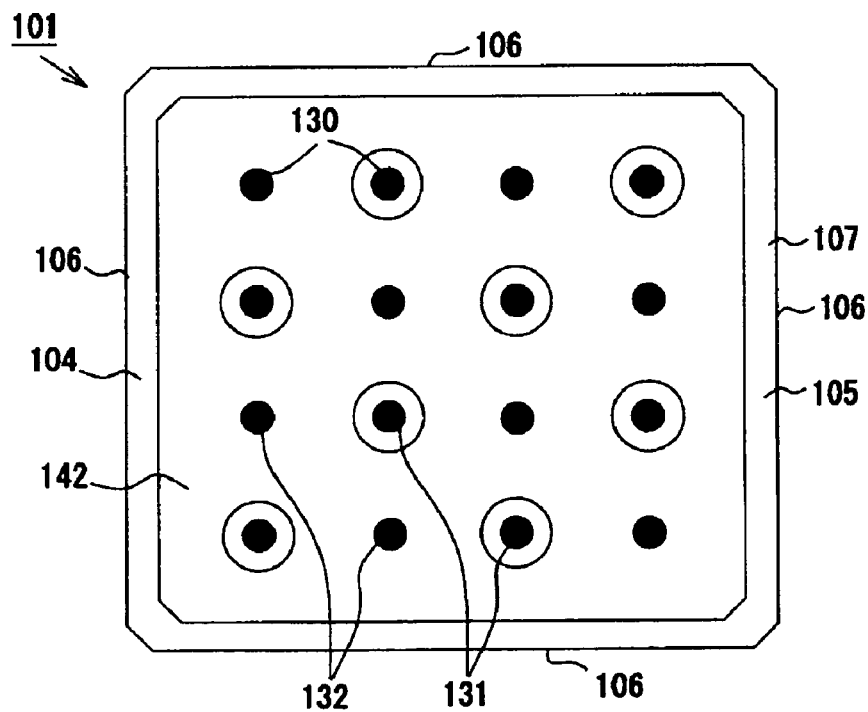
FIG. 4 is an explanatory schematic plan view for explaining the connection with the inner electrode and the capacitor via conductor in the capacitor forming layer portion.
Figure 5:
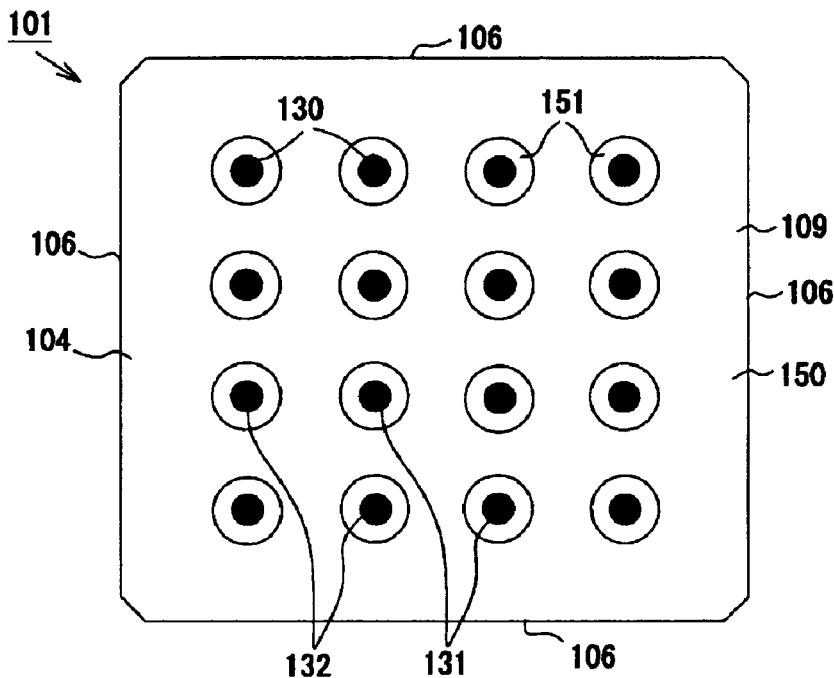
FIG. 5 is an explanatory schematic plan view showing a third land-shaped conductor in an interlayer portion.
Figure 6:
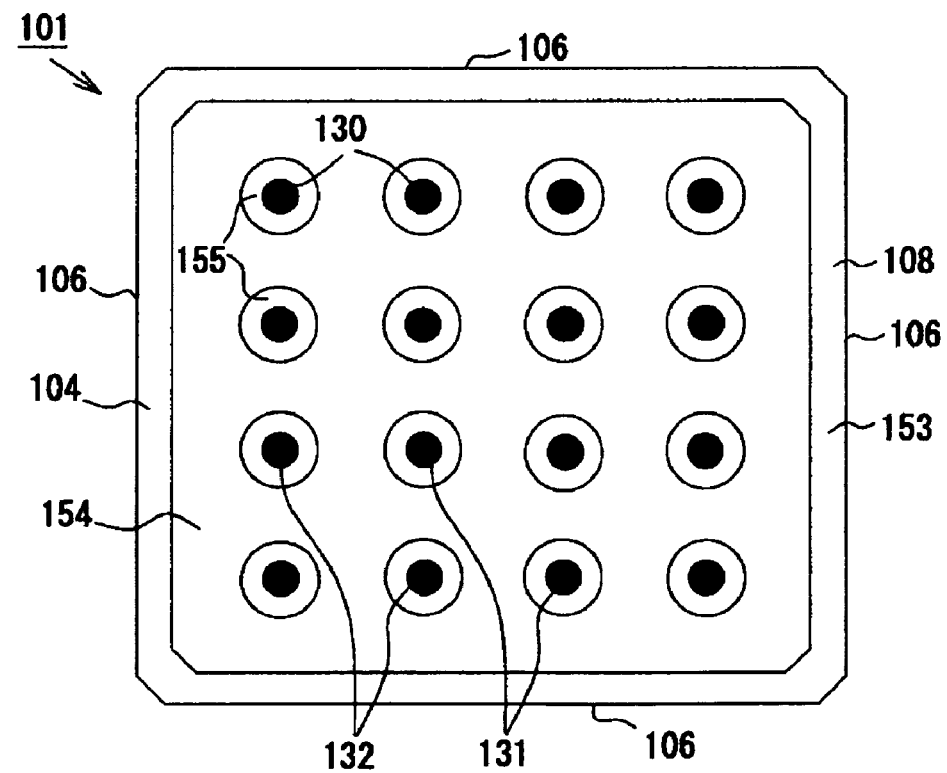
FIG. 6 is an explanatory schematic plan view showing a dummy electrode in cover layer portion.

As shown in FIGS. 1 and 2, the ceramic capacitor 101 according to the first embodiment is a so-called "a via array type capacitor". A ceramic sintered body 104 comprising the ceramic capacitor 101 assumes a plate-like shape and has the capacitor main surface 102 (upper surface in FIG. 1), a capacitor rear surface 103 (lower surface in FIG. 1) and four capacitor side faces 106.

The ceramic sintered body 104 is comprised of a capacitor forming layer portion 107 (first dielectric laminated portion), a cover layer portion 108 (second dielectric laminated portion) and an interlayer portion 109 (third dielectric laminated portion). The capacitor forming layer portion 107 has a structure in which a plurality of ceramic dielectric layers 105 (first dielectric layer) and a plurality of inner electrodes 141, 142 are alternately laminated. The capacitor forming layer portion 107 is disposed on both upper and lower side of the ceramic sintered body 104. The inner electrodes provided in the capacitor forming layer portion 107 has a power supplying inner electrode 141 and a grounding inner electrode 142 which are alternately laminated by sandwiching the ceramic dielectric layer 105. The ceramic dielectric layer 105 is preferably comprised of a sintered body of barium titanate, i.e., a high-dielectric-constant ceramic, and functions as a dielectric (insulator) between the power supplying inner electrode layer 141 and the grounding inner electrode layer 142. The power supplying inner electrode layer 141 and the grounding inner electrode layer 142 are comprised of nickel as a main constituent.

As shown in FIGS. 2 to 6, a plurality of via holes 130 is formed in the ceramic sintered body 104. These via holes 130 penetrate the ceramic sintered body 104 in its thicknesswise direction, and are disposed on the entire surface of the ceramic sintered body 104 in a lattice pattern (the form of array). In each via hole 130, a plurality of capacitor via conductors 131, 132 comprised mainly of nickel is formed so as to communicate between the capacitor main surface 102 and the capacitor rear surface 103 of the ceramic sintered body 104. Each power supplying capacitor via conductor 131 penetrates each power supplying inner electrode 141 so as to electrically connect therebetween (see FIGS. 2 and 3). Each grounding capacitor via conductor 132 penetrates each grounding inner electrode 142 so as to electrically connect therebetween (see FIGS. 2 and 4). Each power supplying capacitor via conductor 131 and each grounding capacitor via conductor 132 are disposed in the form of an array as a whole. In this embodiment, for explanatory purposes, the capacitor via conductors 131, 132 are illustrated by 4×4 rows forming an array. However, the actual array has more rows.

The interlayer portion 109 is disposed between the upper capacitor forming layer portion 107 and the lower capacitor forming layer portion 107. Unlike the capacitor forming layer portion 107, the interlayer portion 109 has no inner electrode 141, 142. More particularly, the interlayer portion 109 has a structure in which a plurality of ceramic dielectric layers 150 (third dielectric layer) and a plurality of third land-shaped conductors 151 connected to the peripheral portion of the capacitor via conductor 131, 132 are alternately laminated. The third land-shaped conductor 151 of the interlayer portion 109 is made of the same material (a metal material made of nickel as a main constituent) as that of the inner electrodes 141, 142 and is formed to have a thickness equal to or greater than the thickness of the inner electrodes 141, 142 of the capacitor forming layer portion 107. In order to compensate a difference in thickness in the capacitor forming layer portion 107, the third land-shaped conductor 151 is formed in an annular shape so as to surround the perimeter of the capacitor via conductor 131, 132 (see FIGS. 2 and 5). Each ceramic dielectric layer 150 of the interlayer portion 109 is made of the same material (i.e., barium titanate) as that of the ceramic dielectric layer 105 and is formed to be thicker than the ceramic dielectric layer 105 of the capacitor forming layer portion 107.

The cover layer portion 108 is disposed so as to be exposed at a surface portion of the ceramic sintered body 104. That is, the upper cover layer portion 108 is formed to cover an upper surface of the capacitor forming layer portion 107 while the lower cover layer portion 108 is formed to cover a lower surface of the capacitor forming layer portion 107. The cover layer portion 108 has a structure in which a plurality of ceramic dielectric layers 153 (second dielectric layer) and a plurality of dummy electrodes 154 not connected to the peripheral portion of the capacitor via conductors 131, 132 are laminated. Each dummy electrode 154 of the cover layer portion 108 is made of the same material (preferably a metal material made of nickel as the main constituent) as that of the inner electrodes 141, 142 and is formed to have a thickness equal to or greater than the inner electrode 141, 142 of the capacitor forming layer portion 107. Each dummy electrode 154 is of a solid pattern or configuration formed around the capacitor via conductors 131, 132 with a predetermined clearance 155 therebetween. In other words, each dummy electrode 154 is of an annular shape surrounding, and spaced with a predetermined clearance 155 from, a corresponding via conductor (refer to FIG. 6). Further, the ceramic dielectric layer 153 of the cover layer portion 108 is made of the same material (i.e., barium titanate) as that of the ceramic dielectric layer 105 and is formed to be thicker than the ceramic dielectric layer 105 of the capacitor forming layer portion 107.

As shown in FIGS. 1 and 2, a plurality of main surface side power supplying electrodes 111 (terminal electrodes) and a plurality of main surface side grounding electrodes 112 (terminal electrodes) are formed on the capacitor main surface 102 of the ceramic sintered body 104 so as to project from the capacitor main surface 102. Although each main surface side grounding electrode 112 is individually formed on the capacitor main surface 102, it may be integrally formed. The main surface side power supplying electrode 111 is directly connected to an end face of the plural power supplying via conductors 131 at the capacitor main surface 102. The main surface side grounding electrode 112 is directly connected to an end face of the plural grounding via conductors 132 at the capacitor main surface 102.

Also, a plurality of rear surface side power supplying electrode terminals 121 (terminal electrodes) and a plurality of rear surface side grounding electrodes 122 (terminal electrodes) are formed on the capacitor rear surface 103 of the ceramic sintered body 104 so as to project from the capacitor rear surface 103. Although each rear surface side grounding electrode 122 is individually formed on the capacitor rear surface 103, it may be integrally formed. The rear surface side power supplying electrode 121 is directly connected to an end face of the plural power supplying via conductors 131 at the capacitor rear surface 103. The rear surface side grounding electrode 122 is directly connected to an end face of the plural grounding via conductors 132 at the capacitor rear surface 103. Thus, the power supplying electrodes 111, 112 is electrically connected to the power supplying via conductor 131 and the power supplying inner electrode layer 141. On the other hand, the grounding electrodes 112, 122 are electrically connected to the grounding via conductor 132 and the grounding inner electrode layer 142.

As shown in FIG. 1, the electrodes 111,112 provided on the capacitor main surface 102 are electrically connected to the IC-chip 21 through the via conductors 43, the conductors 42, the via conductors 47, the terminal pads 44, the solder bumps 45 and the surface connection terminals 22 of the IC-chip 21. On the other hand, the electrodes 121,122 provided on the capacitor rear surface 103 are electrically connected to an electrode (non contact terminal) provided in a motherboard (not illustrated) through the via conductors 43, the conductors 42, the via conductors 47, the BGA pads 48 and the solder bumps 49.

As shown in FIG. 2, the electrodes 111, 112, 121, 122, which are comprised mainly of nickel, have the surfaces thereof entirely covered with a copper plating layer (not illustrated). The electrodes 111, 112, 121, 122 and the capacitor via conductors 131,132 are disposed directly under the generally center of the IC chip 21. In the first embodiment, the diameter of the electrodes 111, 112, 121, 122 is about 500 μm.

For example, when electric conduction is effected from the motherboard side through the electrode terminal 121, 122 to apply a voltage across the power supplying inner electrode 141 to the grounding inner electrode 142, positive charges, for example, are accumulated in the power supplying inner electrode 141, while negative charges, for example, are accumulated in the grounding inner electrode 142. As a result, the ceramic capacitor 101 functions as a capacitor. In addition, in the ceramic capacitor 101, the power supplying via conductor 131 and the grounding via conductor 132 are disposed adjacent to each other, so that the direction of current flowing through the power supplying via conductor 131 and the grounding via conductor 132 opposite to each other. As a result, a reduction in the inductance of the component impedance is attained.

The ceramic capacitor 101 is produced as follows. A first ceramic green sheet having a thickness of 7 micrometers and a second ceramic green sheet having a thickness of 30 micrometers are formed. Then, nickel paste for inner electrodes is screen-printed on the first green sheet and is allowed to dry. In consequence, power supplying inner electrode portions and grounding inner electrode portions, which serve later as the power supplying inner electrode 141 and the grounding inner electrode 142, respectively, are formed. Next, nickel paste for dummy electrodes is screen-printed on the second green sheet and is allowed to dry to thereby form a dummy electrode portion, which serves later as the dummy electrode 154. Further, nickel paste for conductors is screen-printed on the second green sheet and is allowed to dry to thereby form a land-shaped conductor portion, which serves later as the third land-shaped conductor 151.

Next, in a portion corresponding to the capacitor forming layer portion 107, the first green sheets in which the power supplying inner electrode portion is formed and the first green sheets in which the grounding inner electrode portion is formed are alternately laminated. In a portion corresponding to the cover layer portion 108, the second green sheets in which the dummy electrode portion is formed is laminated. Further, in a portion corresponding to the interlayer portion 109, the second green sheets in which the land-shaped conductor portion is formed is laminated. Then, a pressing force is imparted to the green sheets in the laminated direction of the sheets, thereby integrating the green sheets and forming a green sheet laminated body.

Further, a plurality of via holes 130 are formed in the green sheet laminated body using a laser processing machine, and nickel paste for via conductors is filled in each via hole 130 using a press-fitting and filling machine (not illustrated). Next, a paste is printed on the upper surface of the green sheet laminated body to form the main surface side power supplying electrodes 111 and the main surface side grounding electrodes 112 so as to cover the upper end face of each conductor portion at the upper side of the green sheet laminated body. Also, the paste is printed on the lower surface of the green sheet laminated body to form the rear surface side power supplying electrodes 121 and the rear surface side grounding electrodes 122 so as to cover the lower end face of each conductor portion at the lower side of the green sheet laminated body.

Subsequently, the green sheet laminated body is allowed to dry so that each electrode 111,112,121,122 is solidified to some extent. Next, the green sheet laminated body is degreased and subjected to firing at a predetermined temperature for a predetermined period. As a result, barium titanate and nickel contained in the paste are simultaneously sintered, thereby forming the ceramic sintered body 104.

Next, the electroless copper plating (which is about 10 μm in thickness in a exemplary implementation) is applied to each electrode terminal 111, 112, 121, 122 of the ceramic sintered body 104. As a result, the copper plating layer is formed on each electrode terminal 111, 112, 121, 122, and the ceramic capacitor 101 is completed.

When the ceramic capacitor 101 is built-in the wiring board 10, the core board 11 having the accommodation hole 91 is produced in advance by the conventional known method.

Then, the ceramic capacitor 101 is accommodated in the accommodation hole 91 of the core board 11. The gap between the inner face of the accommodation hole 91 and the side face 106 of the ceramic capacitor 101 is filled with the filler 92 made of thermosetting resin. The filler 92 is subjected to a heat treatment so that it hardens and fixes the ceramic capacitor 101 to the accommodation hole 91.

Furthermore, using a conventionally known method, the buildup layer 31 is formed on the upper surface 12 of the core board 11 and the upper surface 102 of the ceramic capacitor 101 while forming the buildup layer 32 on the lower surface 13 of the core board 11 and the lower surface 103 of the ceramic capacitor 101. As a result, the wiring board 10 comprised of the core board 11 and the buildup layers 31,32 is completed.

Therefore, according to the first embodiment described above, the following effects can be obtained.

With the ceramic capacitor 101 of the first embodiment, since the large-sized dummy electrode 154 is formed in the cover layer portion 108 provided in the surface portion of the ceramic capacitor 101, the toughness of the surface portion is improved. In the fixation process of the ceramic capacitor 101, for example, when the ceramic capacitor 101 is fixed in the accommodation hole 91 of the core board 11 with the filler 92, the filler 92 is hardened and contracts with the heat treatment. Further, when the buildup layers 31,32 are formed on the upper surface 12 and the lower surface 13 of the core board 11, respectively, a film-like insulating resin material serving later as the interlayer insulating layers 33, 34, 35, 36 is hardened and contracts with a pressure heat-treatment. In this case, although the external stress is applied to the surface of the ceramic capacitor 101, the toughness of the cover layer portion 108 is fully maintained by providing the dummy electrode 154. Thus, a crack is unlikely to occur near the capacitor via conductors 131,132 in the cover layer portion 108. Further, even when the dummy electrode 154 is formed in the surface portion of the capacitor 101, the moisture, which tends to penetrate through a connection between the dummy electrode 154 and the capacitor via conductor 131, 132, is unlikely to penetrate into the capacitor 101 because the dummy electrode 154 is not connected to the capacitor via conductor 131,132. As a result, moisture resistance of the capacitor 101 can fully be maintained.

Also with the ceramic capacitor 101 of the first embodiment, the ceramic dielectric layer 153 of the cover layer portion 108 is formed to be thicker than the ceramic dielectric layer 105 of the capacitor forming layer portion 107. The dummy electrode 154 of the cover layer portion 108 is formed to be thicker than the inner electrode 141,142 of the capacitor forming layer portion 107. In this way, the intensity of the dummy electrode 154 can fully be maintained and the toughness of the surface portion can further improve. Furthermore, since the ceramic dielectric layer 153 of the cover layer portion 108 is thick, insulation, moisture resistance or the like of the capacitor 101 are fully maintained.

Further, with the ceramic capacitor 101 of the first embodiment, a plurality of third land-shaped conductors 151 connected to the peripheral portion of the capacitor via conductor 131,132 is laminated in interlayer portion 109. Thus, since the difference in thickness due to a formation of electrode can be reliably compensated by forming the third land-shaped conductor 151, the residual stress in the interlayer portion 109 can be reduced. Therefore, the crack generated near the capacitor via conductor 131,132 in the interlayer portion 109 can be reliably prevented. Since the third land-shaped conductor 151 is made of a metal material (i.e., nickel), the toughness of the interlayer portion 109 can be fully maintained compared to the case where the ceramic is used to compensate the difference in thickness. Further, the ceramic dielectric layer 150 of the interlayer portion 109 is formed to be thicker than the ceramic dielectric layer 105 of the capacitor forming layer portion 107. The third land-shaped conductor 151 of the interlayer portion 109 is formed to be thicker than the inner electrode 141,142 of the capacitor forming layer portion 107. In this way, the intensity of the third land-shaped conductor 151 can be fully maintained, thereby reliably preventing the occurrence of cracking in the interlayer portion 109.

In addition, with the ceramic capacitor 101 of the first embodiment, the third land-shaped conductor 151 of the interlayer portion 109 and the dummy electrode 154 of the cover layer portion 108 are made of the same metal material (i.e., nickel paste) as the material of the inner electrode 141, 142 of the capacitor forming layer portion 107. In this way, it is not necessary to prepare an exclusive metal material for forming the third land-shaped conductor 151 and the dummy electrode 154. Further, the third land-shaped conductor 151 and the dummy electrode 154 can be simultaneously fired under the same conditions (the same firing temperature and the same time period) whereby the ceramic capacitor 101 can be manufactured cost-effectively.

In the first embodiment, since the ceramic capacitor 101 is disposed directly under the IC chip 21 mounted on the IC-chip mounting region 23, a wiring connecting the ceramic capacitor 101 and the IC chip 21 becomes short, thereby preventing an increase in the inductance component. Therefore, the switching noise of the IC-chip 21 caused by the ceramic capacitor 101 can be certainly reduced, and the power supply voltage can be stabilized. Further, the noise invading between the IC-chip 21 and the ceramic capacitor 101 can be substantially reduced. As a result, any defects or malfunctions are unlikely to occur and a high reliability wiring board can be achieved.

Further, in the first embodiment, since the IC chip mounting region 23 is located in the region directly above the ceramic capacitor 101, IC-chip 21 mounted on the IC chip mounting region 23 is supported by the ceramic capacitor 101 having high rigidity and a small coefficient of thermal expansion. Thus, in the above-mentioned IC chip mounting region 23, the first buildup layer 31 is unlikely to deform. As a result, the IC chip 21 mounted on the IC chip mounting region 23 can be more stably supported.

SECOND EMBODIMENT

Hereafter, a second embodiment carrying out the present invention will be described with reference to the drawings.

Figure 7:
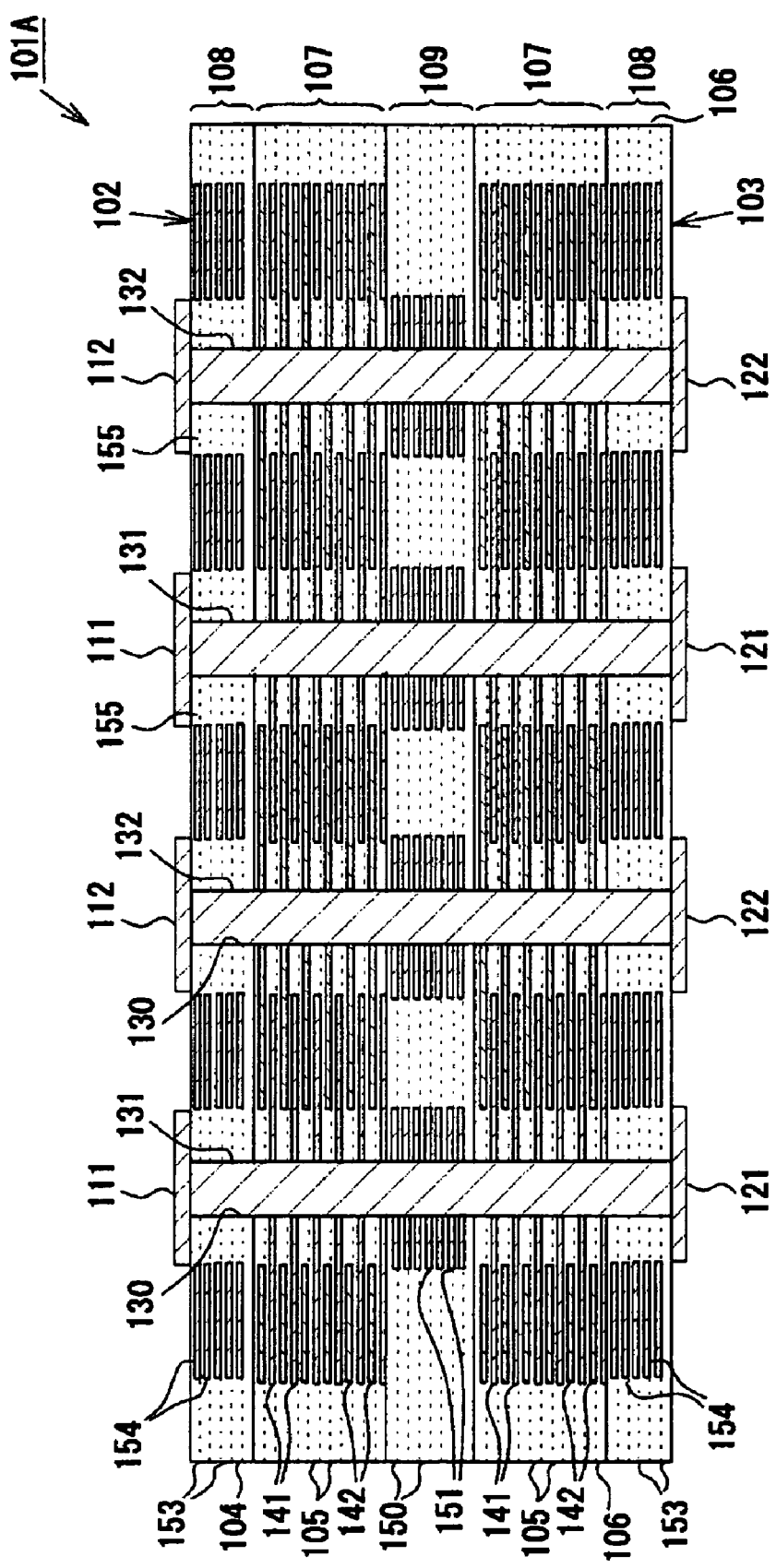
FIG. 7 is a schematic cross sectional view showing a ceramic capacitor according to a second embodiment.

According to the second embodiment, the wiring board 10 includes a ceramic capacitor 101A shown in FIG. 7. In this embodiment, compositions (such as the buildup layers 31, 32) other than the ceramic capacitor 101A are the same as those in the first embodiment, thus, only a composition of the ceramic capacitor 101A will be described in the following.

As shown in FIG. 7, according to the ceramic capacitor 101A of the second embodiment, the thickness of the ceramic dielectric layer 153 of the cover layer portion 108 is equal to that of the ceramic dielectric layer 105 of the capacitor forming layer portion 107. Further, the thickness of the dummy electrode 154 of the cover layer portion 108 is equal to that of the inner electrode 141,142 of the capacitor forming layer portion 107. Furthermore, the thickness of the ceramic dielectric layer 150 of the interlayer portion 109 is equal to that of the ceramic dielectric layer 105 of the capacitor forming layer portion 107. Moreover, the thickness of the third land-shaped conductor 151 of the interlayer portion 109 is equal to that of the inner electrode 141,142 of the capacitor forming layer portion 107.

Thus, when the ceramic capacitor 101A is constituted in this way, green sheets each having the same thickness can be used, thereby achieving the cost-effective manufacturing. Further, since a pitch between the dummy electrodes 154 in the cover layer portion 108 becomes narrow, cracking near the capacitor via conductor 131,132 can be reliably prevented. Furthermore, a pitch between the third land-shaped conductors 151 in the interlayer portion 109 becomes narrow, a crack generated near the capacitor via conductor 131,132 can be reliably prevented.

THIRD EMBODIMENT

Hereafter, a third embodiment carrying out the present invention will be described with reference to the drawings. The wiring board 10 according to the third embodiment includes a ceramic capacitor 101B shown in FIG. 8, which is the only difference compared to the first embodiment. Hereafter, the composition of the ceramic capacitor 101B will be described.

Figure 8:
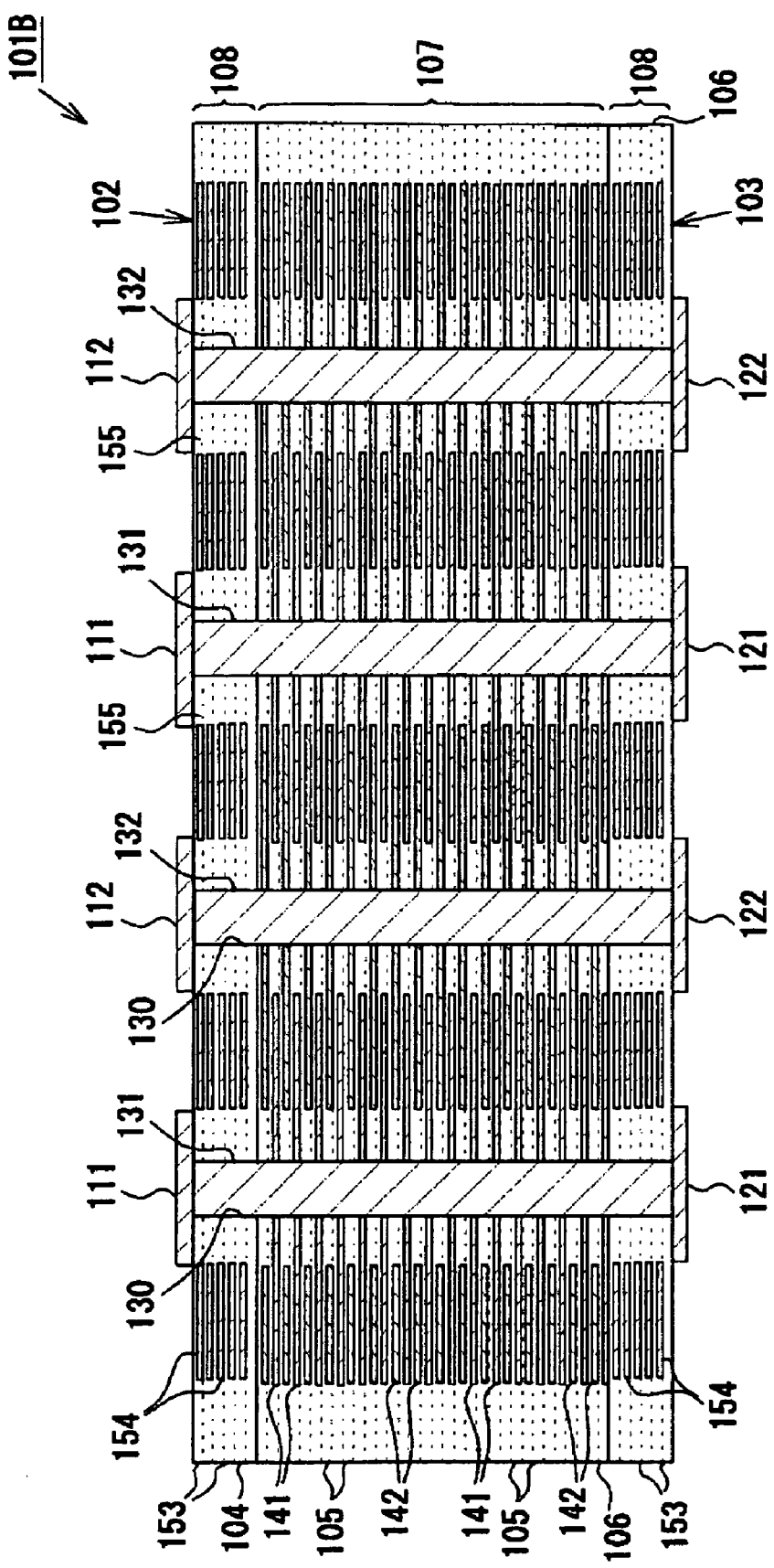
FIG. 8 is a schematic cross sectional view showing a ceramic capacitor according to a third embodiment.

As shown in FIG. 8, the ceramic capacitor 101B does not include the interlayer portion and is comprised of the capacitor forming layer portion 107 and the cover layer portions 108. The thickness of the ceramic dielectric layer 153 of the cover layer portion 108 is equal to that of the ceramic dielectric layer 105 of the capacitor forming layer portion 107. The thickness of the dummy electrode 154 of the cover layer portion 108 is equal to that of the inner electrode 141,142 of the capacitor forming layer portion 107. Thus, when the ceramic capacitor 101B is formed in this way, green sheets each having the same thickness can be used, thereby achieving the cost-effective manufacturing. Further, since a pitch between the dummy electrodes 154 in the cover layer portion 108 becomes narrow, cracking near the capacitor via conductor 131,132 can be reliably prevented. Furthermore, since the capacitor forming layer portion 107 can be enlarged, the capacity of the ceramic capacitor 101B can fully be maintained.

The above-described embodiments of the present invention may be modified as follows.

Figure 9:
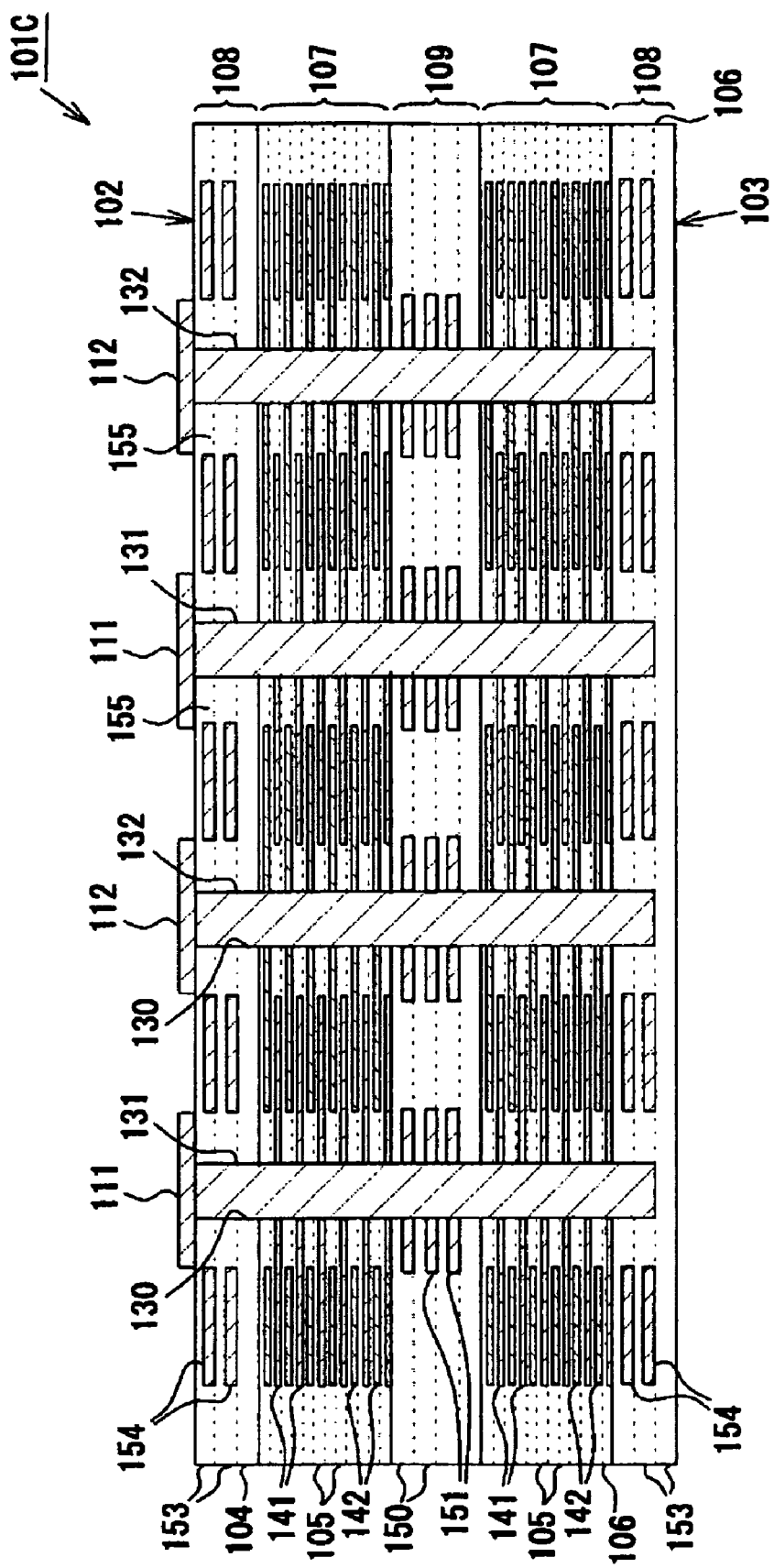
FIG. 9 is a schematic cross sectional view showing a ceramic capacitor according to another embodiment.

In the ceramic capacitors 101, 101A, 101B according to the above embodiments, the terminal electrodes 111,112,121, 122 are formed on both the capacitor main surface 102 and the capacitor rear surface 103. However, as a ceramic capacitor 101C in FIG. 9, the terminal electrode 111, 112 may be, for example, formed only on the capacitor main surface 102. In addition, other compositions of the ceramic capacitor 101C (e.g., the capacitor forming layer portion 107, the cover layer portion 108, the interlayer portion 109 and the like) are the same as that of the ceramic capacitor 101 according to the first embodiment.

Figure 10:
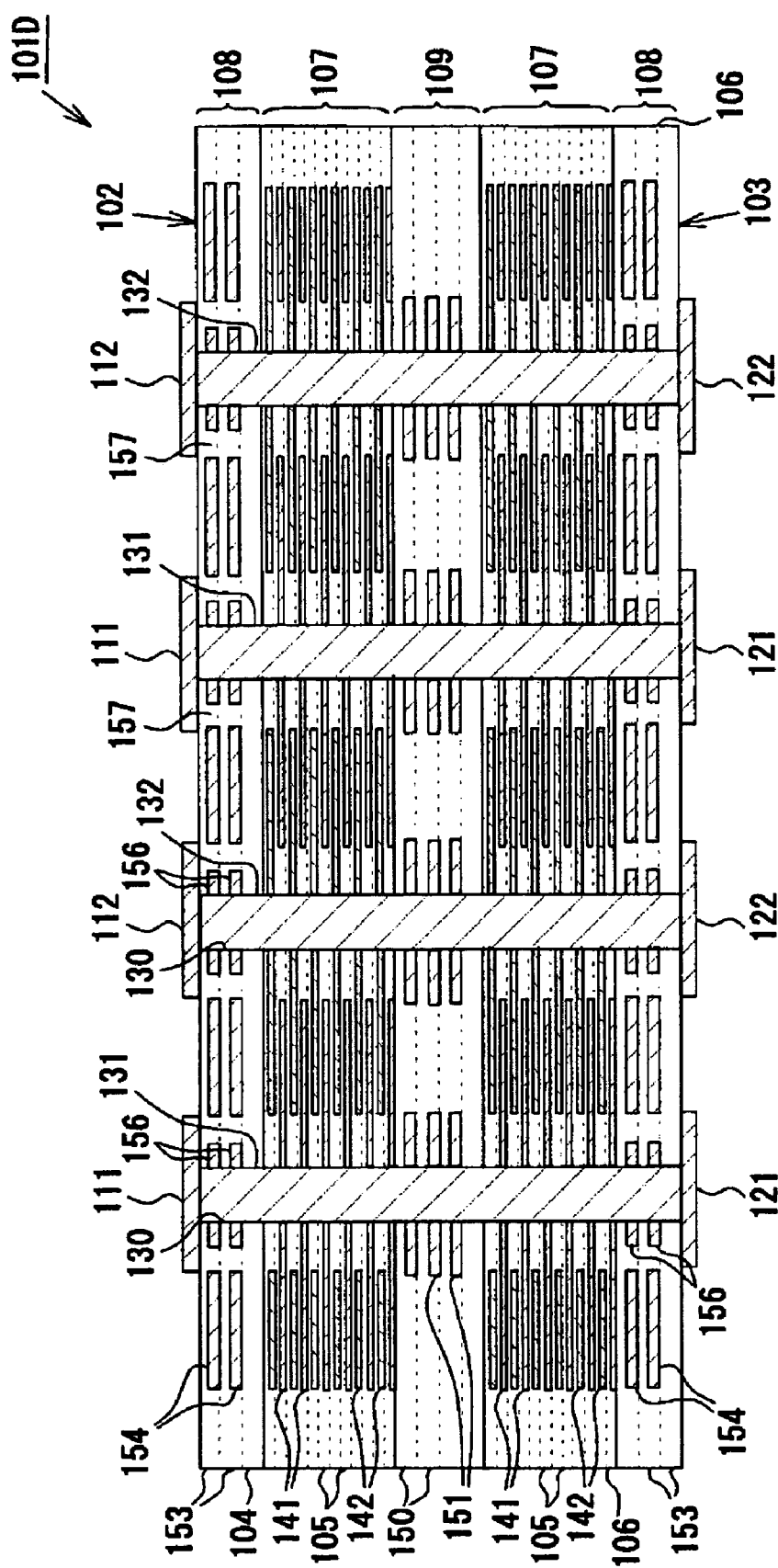
FIG. 10 is a schematic cross sectional view showing a ceramic capacitor according to a further embodiment.

In the ceramic capacitors 101,101A, 101B, 101C according to the above-mentioned embodiments, only the dummy electrode 154 is formed in the cover layer portion 108. However, as a ceramic capacitor 101D in FIG. 10, a plurality of second land-shaped conductors 156 connected to the peripheral portion of the plurality of capacitor via conductors 131, 132 may be, for example, formed in the cover layer portion 108 where the dummy electrode 154 is formed. The second land-shaped conductor 156 is smaller in an outer diameter than that of the third land-shaped conductor 151 formed in the interlayer portion 109. A predetermined clearance 157 is formed between the second land-shaped conductor 156 and the dummy electrode 154. In the cover layer portion 108 of the ceramic capacitor 101D, although a difference in thickness (due to a formation of electrode) arises in the thickness direction between a portion where the dummy electrode 154 is formed and a portion where no dummy electrode is formed, the difference in thickness can be compensated by forming the second land-shaped conductor 156. As a result, the occurrence of cracking can be further prevented.

Figure 11:
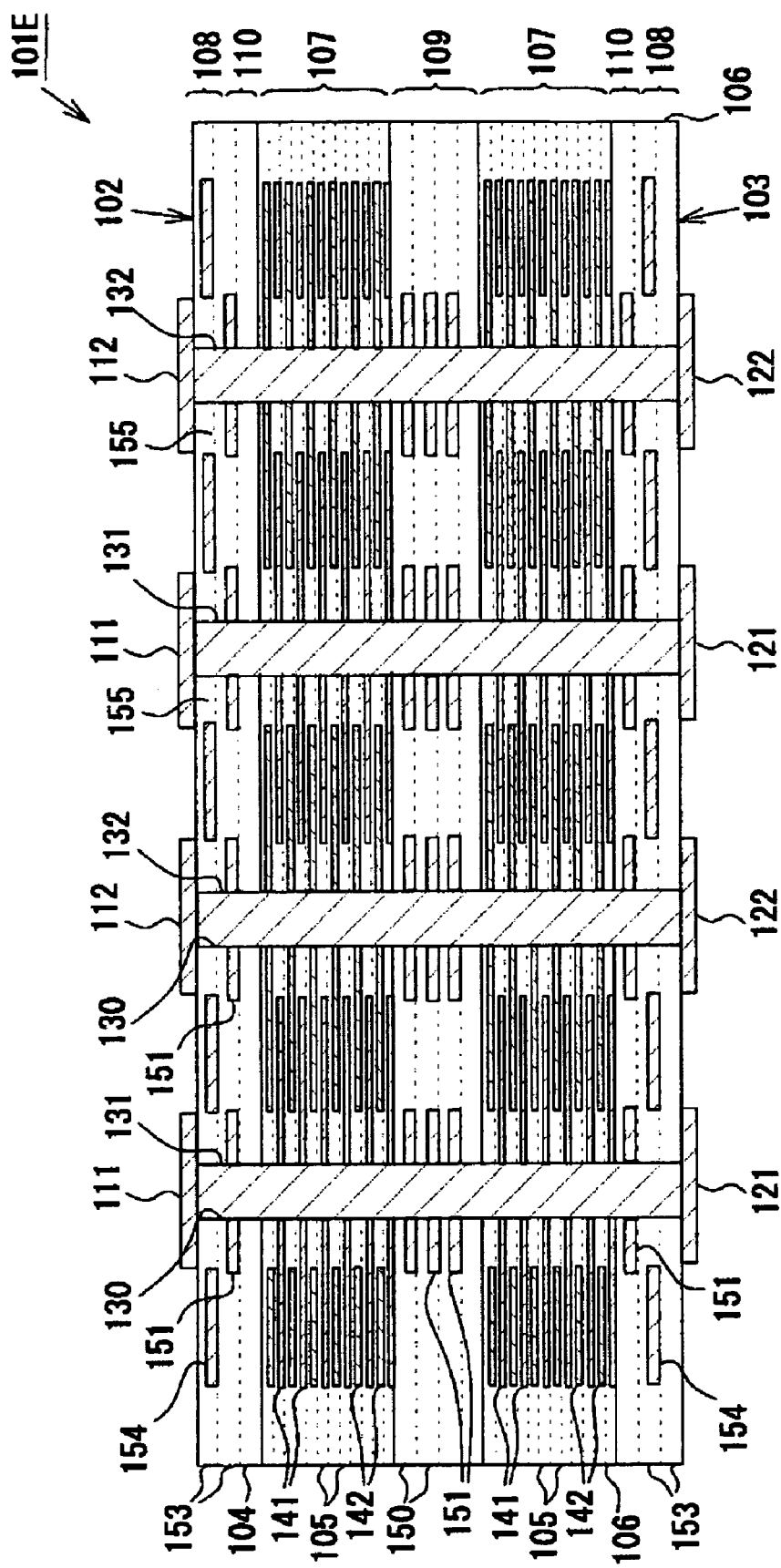
FIG. 11 is a schematic cross sectional view showing a ceramic capacitor according to yet another embodiment.

In the ceramic capacitor 101,101A,101C,101D according to the above embodiments, the third land-shaped conductor 151 is formed in the interlayer portion 109, however, as a ceramic capacitor 101E in FIG. 11, a land-shaped conductor 151 may be formed between the capacitor forming layer portion 107 and the cover layer portion 108 in addition to the interlayer portion 109. In this case, a fourth dielectric laminated portion 110 is formed between the capacitor forming layer portion 107 (first dielectric laminated portion) and the cover layer portion 108 (second dielectric laminated portion). In this way, the difference in thickness can also be reliably compensated, thereby further preventing the occurrence of cracking.

Figure 12:
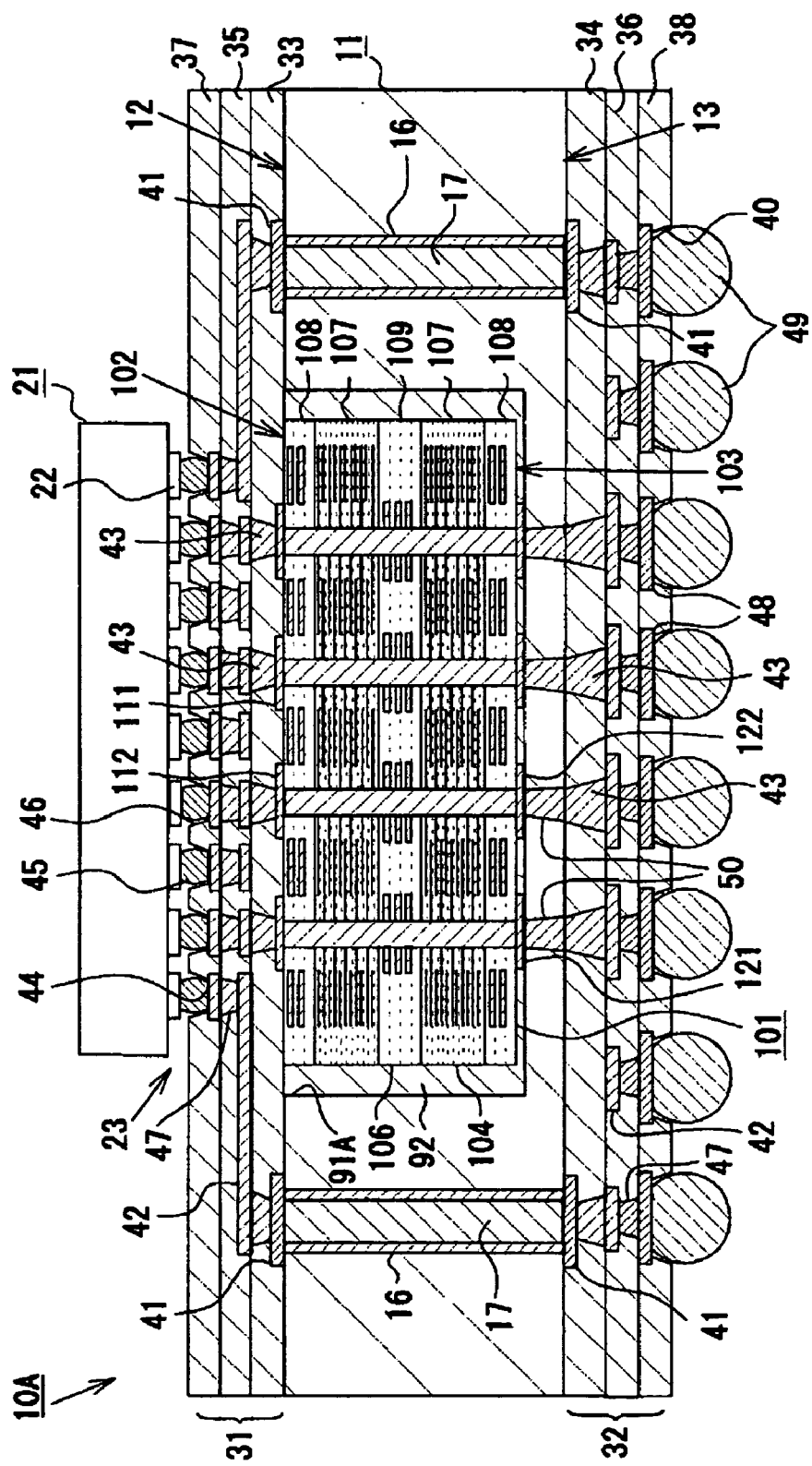
FIG. 12 is a schematic cross sectional view showing a wiring board according to a further embodiment.

The wiring board 10 according to the above embodiment, the ceramic capacitor 101,101A-101E is built-in the accommodation hole 91 which opens at the upper surface 12 and the lower surface 13 of the core board 11. However, similar to a wiring board 10A shown in FIG. 12, the ceramic capacitor 101 may be, for example, accommodated in an accommodation hole 91A assuming a bottomed concave shape (non-through hole) and only opening at the upper surface 12 of the core board 11. It is noted that the ceramic capacitor 101 has the same composition as that of the first embodiment. In the wiring board 10A, the entire resin interlayer insulating layer 34 of the second buildup layer 32 is in contact with the lower surface 13 of the core board 11. Further, the second buildup layer 32 is electrically connected to the ceramic capacitor 101 through a plurality of via conductor 50, which penetrates both a bottom surface of the accommodation hole 91A and the lower surface 13 of the core board 11. Also, in the wiring board 10A, the same effect as that of the first embodiment can be obtained.

Although the wiring board 10 and 10A according to the above embodiments is used for a BGA (ball grid array) type package, it may be used for, for example, PGA (pin grid array) type, LGA (land grid array) type or the like.

Figure 13:
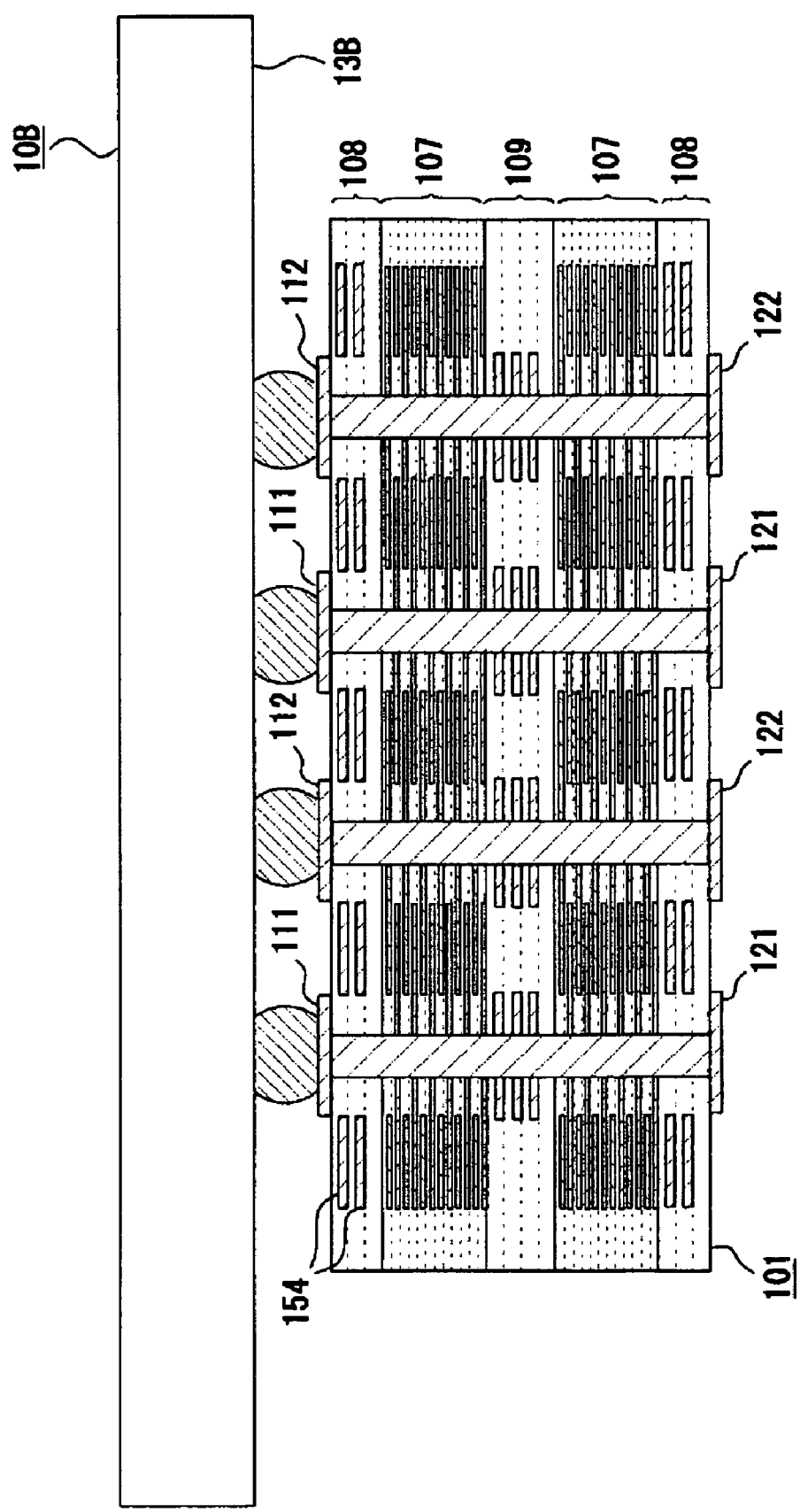
FIG. 13 is a schematic cross sectional view showing a wiring board according to yet another embodiment.

Although the ceramic capacitor 101,101A-101E is built-in the wiring board 10, 10A in the above embodiments, the ceramic capacitor 101,101A-101E may be surface-mounted on a main surface of the wiring board as shown in FIG. 13. In a wiring board 10B in FIG. 13, the ceramic capacitor 101 is surface-mounted on a lower surface 13B, which serves as a substrate main surface, by a flip-chip method. In the wiring board 10B, when the ceramic capacitor 101 is surface-mounted using a solder, a difference in the thermal expansion between the wiring board 10B and the ceramic capacitor 101 generates a compression stress near the surface of the ceramic capacitor 101. Since the ceramic capacitor 101 includes the large-sized dummy electrode 154 in the cover layer portion 108, the toughness of the ceramic capacitor 101 is fully maintained. Therefore, it is possible to prevent the occurrence of the crack in the cover layer portion 108. Further, even when the crack occurs in the cover layer portion 108, the dummy electrode 154 functions as a shield so that the crack does not progress into an inner layer of the capacitor forming layer portion 107.

Figure 14:
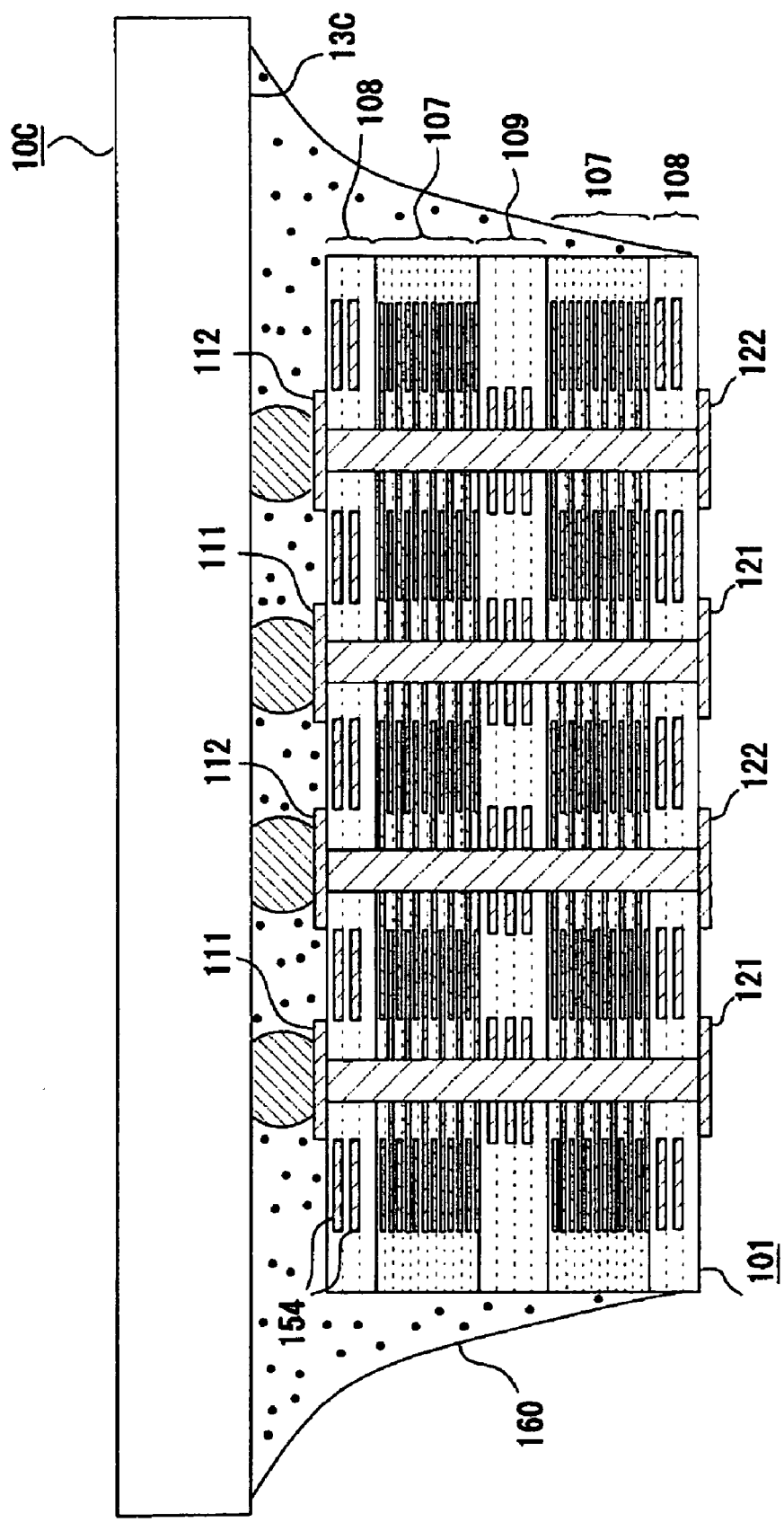
FIG. 14 is a schematic cross sectional view showing a wiring board according to still another embodiment.
Figure 15:
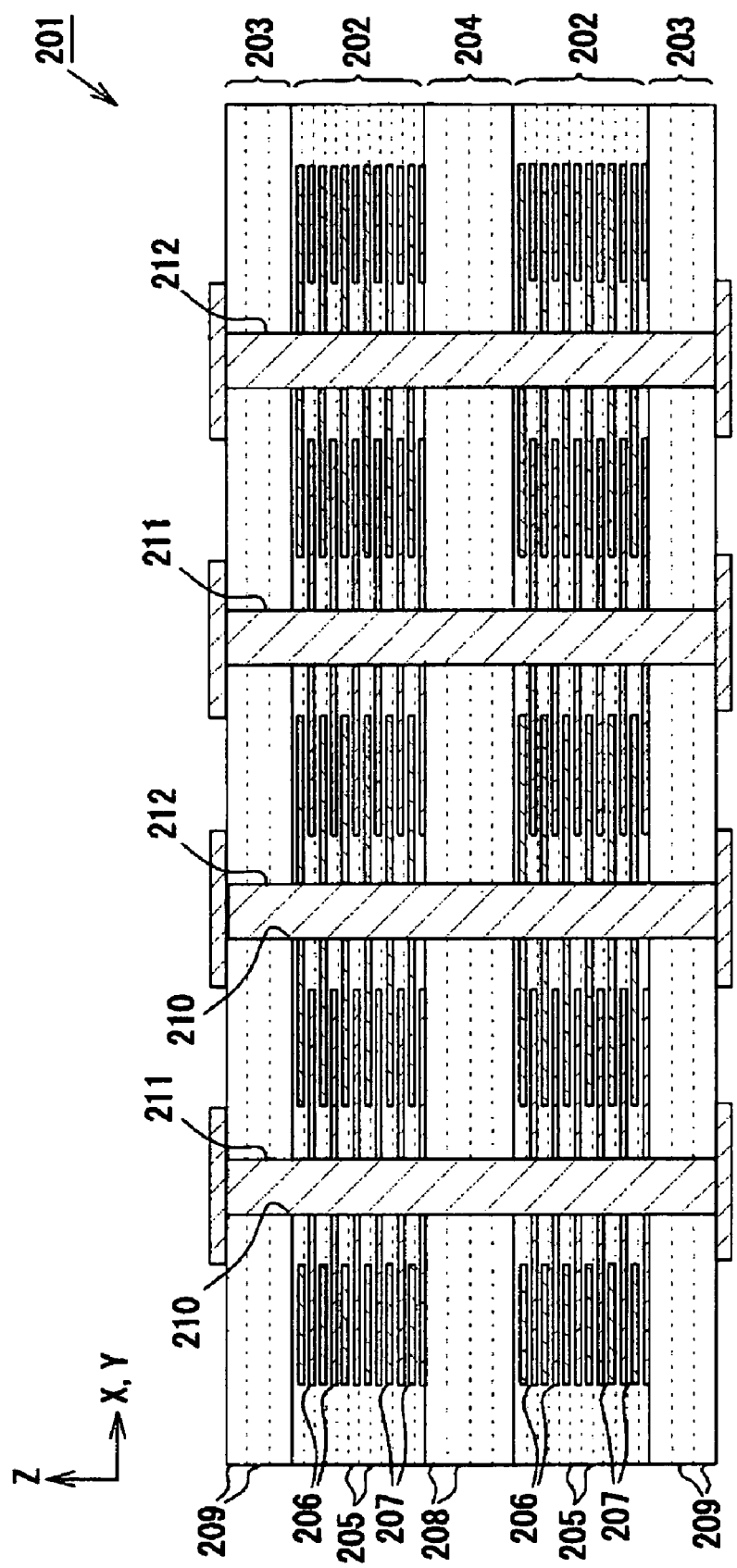
FIG. 15, which was discussed above, is a schematic cross sectional view showing an example of a conventional ceramic capacitor.
Figure 16:
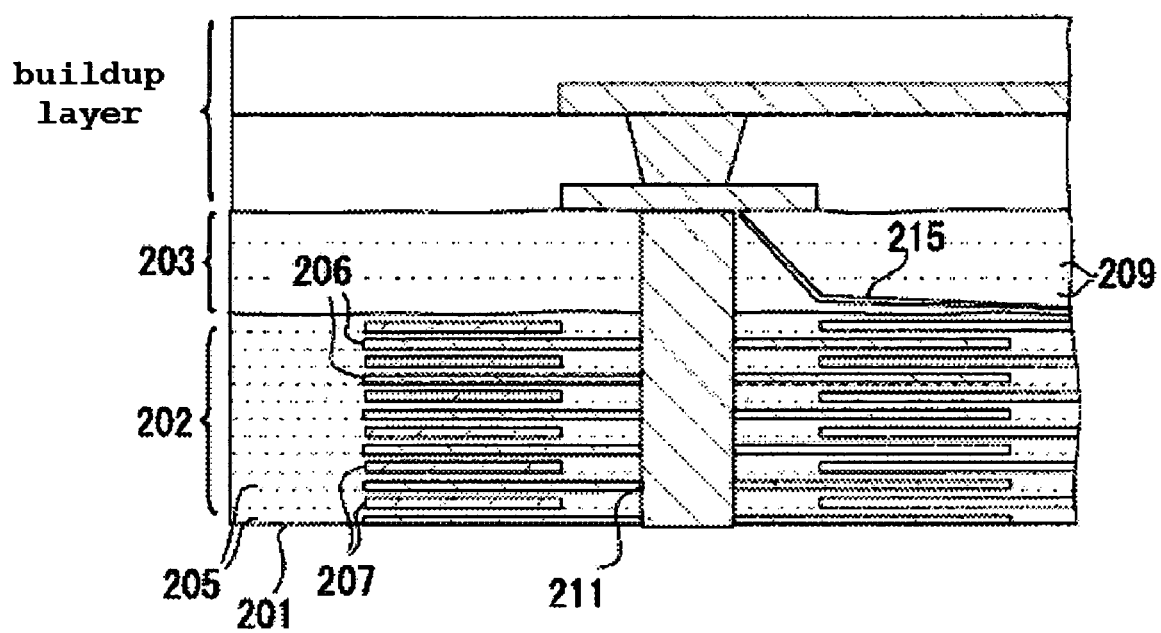
FIG. 16 is an expanded sectional view showing a crack in a surface portion of the conventional ceramic capacitor of FIG. 15.
Figure 17:
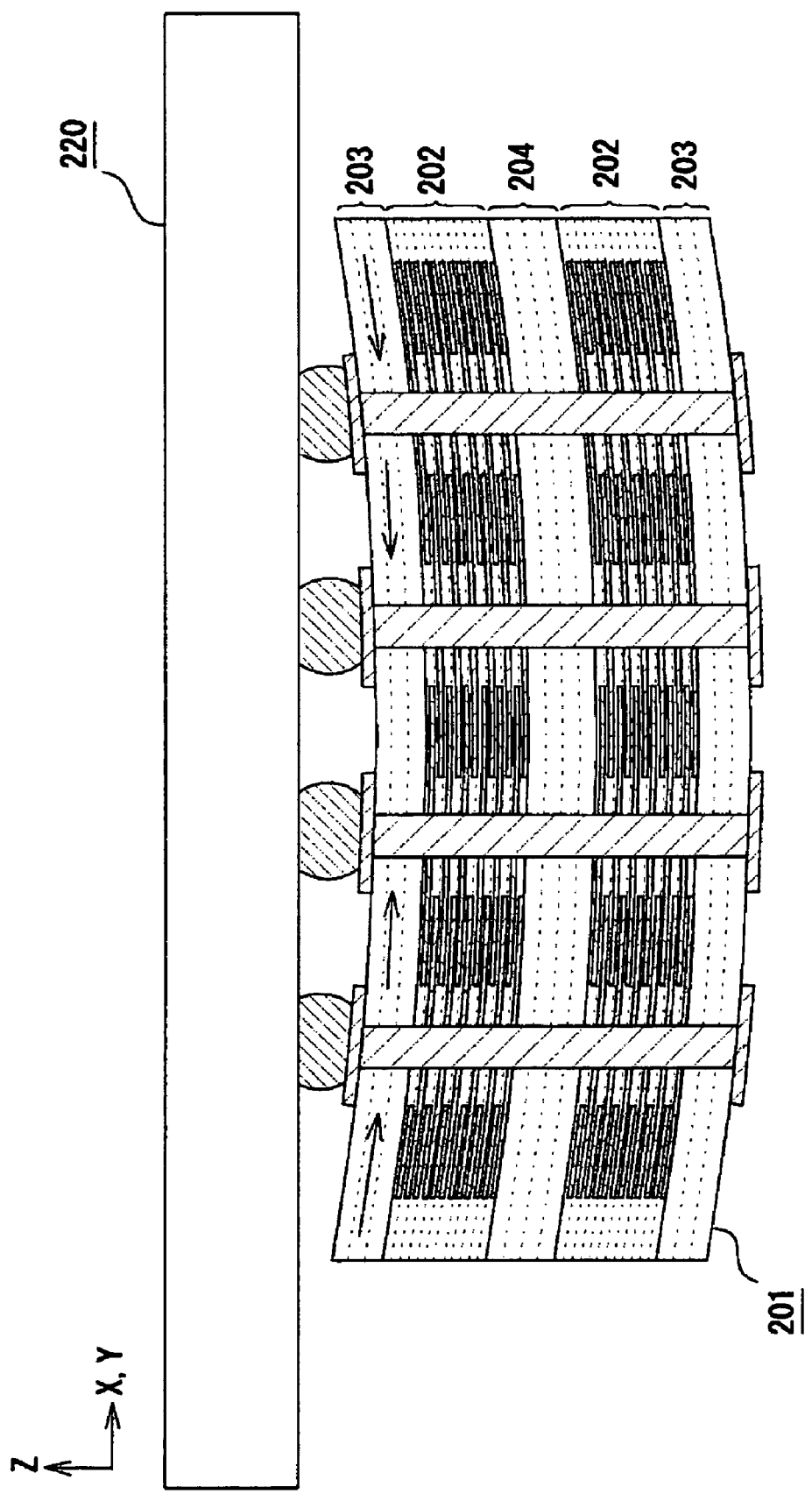
FIG. 17, which was discussed above, is a schematic cross sectional view showing an example of a conventional wiring board.
Figure 18:
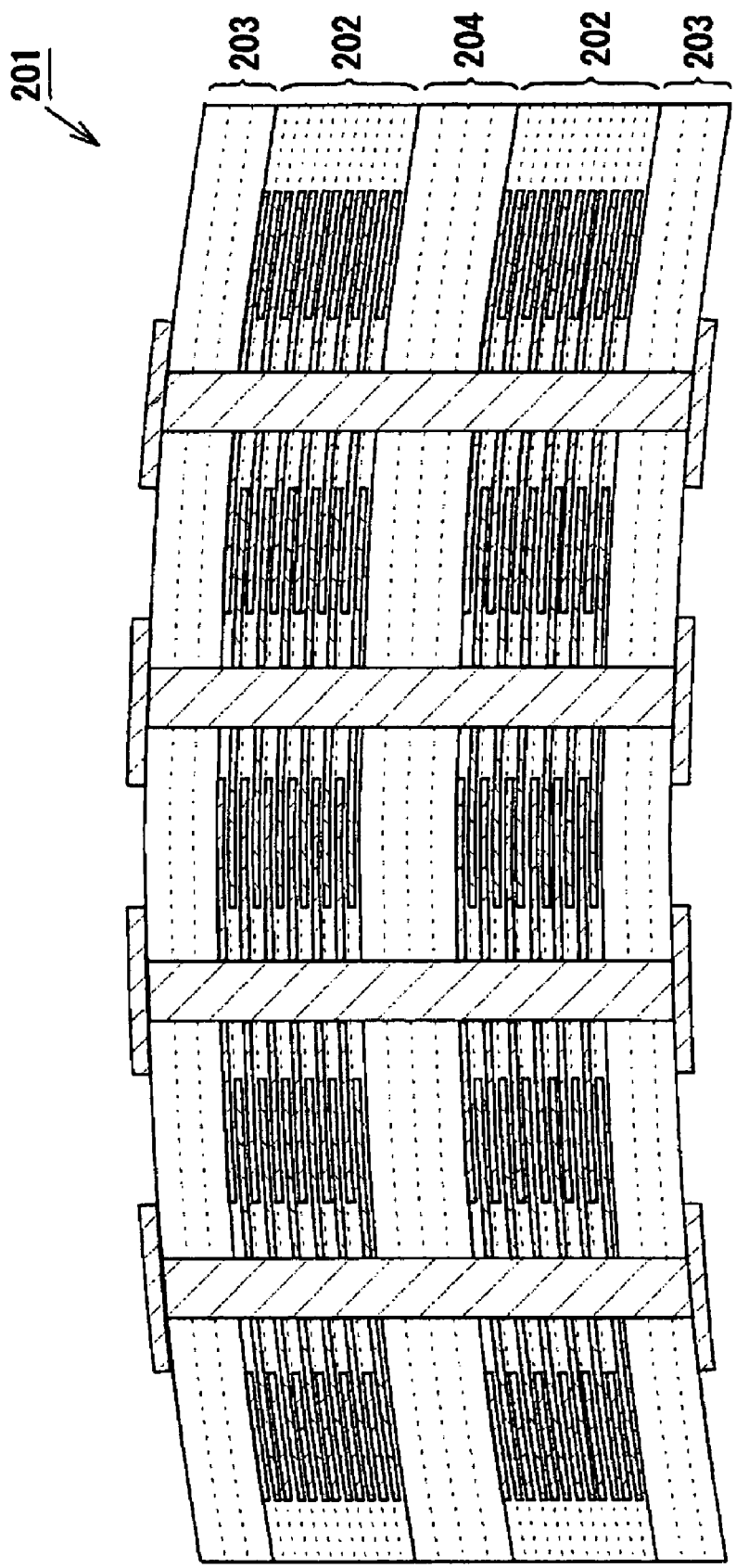
FIG. 18 is a schematic cross sectional view showing an example of the conventional ceramic capacitor of FIG. 15.
Figure 19:
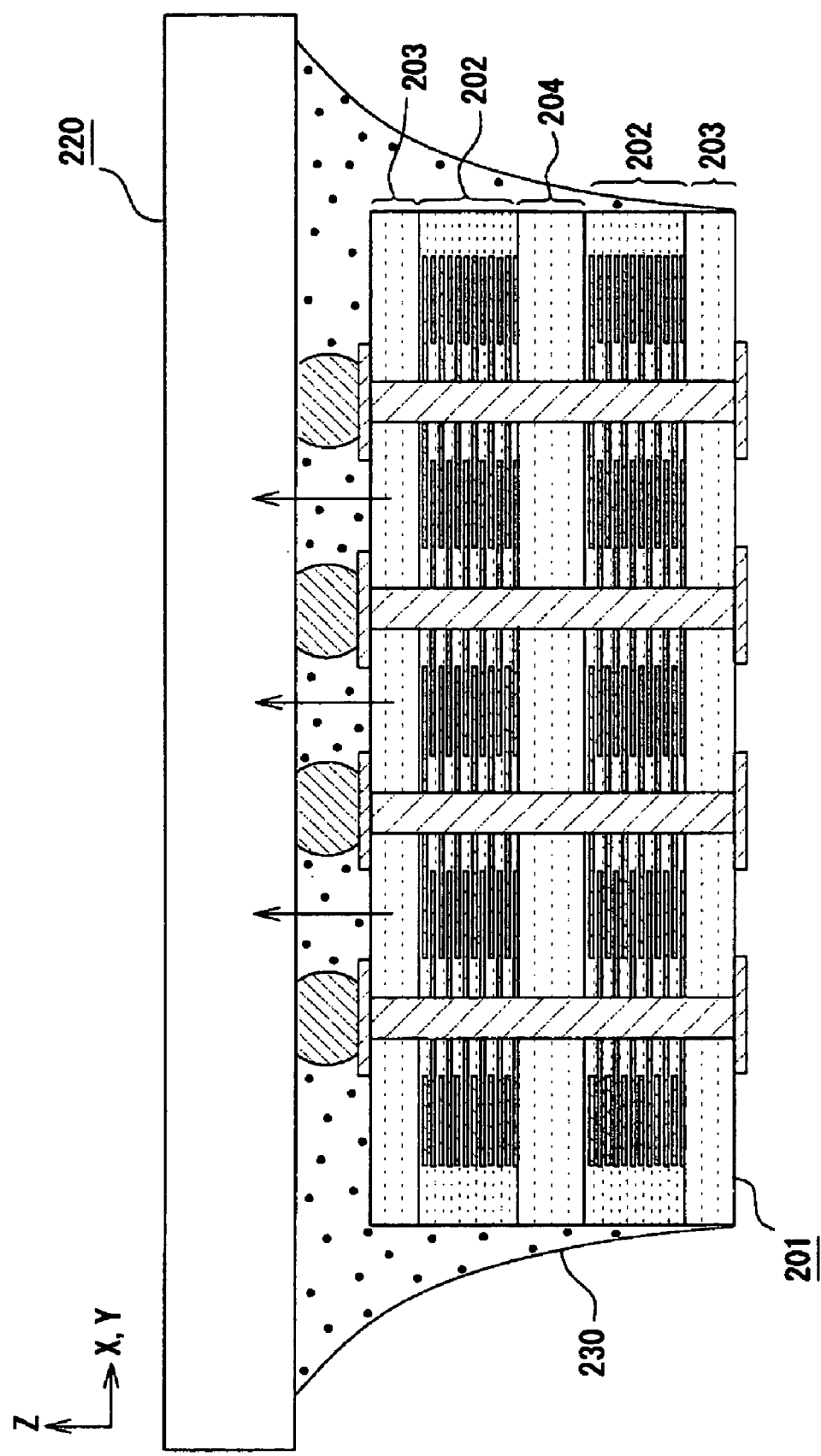
FIG. 19 is a schematic cross sectional view showing an example of the conventional wiring board of FIG. 17.

Further, as a wiring board 10C in FIG. 14, a gap between a lower surface 13C (substrate main surface) and the ceramic capacitor 101 may be sealed with an underfill material 160 (resin material). In the wiring board 10C, a tensile stress acts on the ceramic capacitor 101 due to a curing contraction of the underfill material 160 in a sealing process. Since the ceramic capacitor 101 includes the large-sized dummy electrode 154 in the cover layer portion 108, the toughness of the ceramic capacitor 101 is fully maintained. Therefore, it is possible to prevent the occurrence of cracking in the cover layer portion 108. Furthermore, even when cracking occurs in the cover layer portion 108, the dummy electrode 154 functions as a shield so that cracking does not progress into an inner layer of the capacitor forming layer portion 107.

DESCRIPTION OF REFERENCE NUMERALS 10,10A-10C: wiring board
10B,10C: lower surface serving as a substrate main surface
101,101A-101E: ceramic capacitor serving as a capacitor
102: capacitor main surface
103: capacitor rear surface
104: ceramic sintered body serving as a capacitor main body
105: ceramic dielectric layer serving as a first dielectric layer
107: capacitor forming layer portion serving as a first dielectric laminated portion
108: cover layer portion serving as a second dielectric laminated portion
109: interlayer portion serving as a third dielectric laminated portion
110: fourth dielectric laminated portion
131,132: capacitor via conductor
141,142: inner electrode
150: ceramic dielectric layer serving as a third dielectric layer
151: third land-shaped conductor
153: ceramic dielectric layer serving as a second dielectric layer
154: dummy electrode
156: second land-shaped conductor
160: underfill material Although the invention has been described above in relation to preferred embodiments thereof, it will be understood by those skilled in the art that variations and modifications can be effected in these preferred embodiments without departing from the scope and spirit of the invention.

The invention claimed is:

1. A capacitor comprising:
   a plate-like capacitor main body having a thickness direction and including a capacitor main surface and a capacitor rear surface; and
   a plurality of capacitor via conductors provided in the capacitor main body and extending in the thickness direction of the capacitor main body, the plurality of capacitor via conductors including power supplying via conductors and grounding via conductors;
   wherein the capacitor main body is comprised of:
   a first dielectric laminated portion having a laminated structure including:
      a plurality of first dielectric layers; and
      a plurality of inner electrodes including power supplying inner electrodes and grounding inner electrodes which are alternately laminated by sandwiching the first dielectric layers, the power supplying inner electrodes connected only to the power supplying via conductors, the power supplying via conductors penetrating each of the power supplying inner electrodes so that the power supplying inner electrodes are electrically connected to each other, the grounding inner electrodes connected only to the grounding via conductors, the grounding via conductors penetrating each of the grounding inner electrodes so that the grounding inner electrodes are electrically connected to each other; and a second dielectric laminated portion having a laminated structure including:
a plurality of second dielectric layers;
a plurality of dummy electrodes unconnected to the peripheral portion of the plurality of capacitor via conductors, alternately laminated and disposed so as to be exposed at a surface portion of the capacitor main body; and
a plurality of second, land-shaped conductors connected to the peripheral portion of each of the plurality of capacitor via conductors and formed in the plurality of second dielectric layers in common with an associated dummy electrode.

2. A capacitor according to claim 1,
wherein the second dielectric layer has a thickness greater than that of the first dielectric layer.

3. A capacitor according to claim 1,
wherein the second dielectric layer has a thickness equal to that of the first dielectric layer.

4. A capacitor according to claim 1,
wherein each dummy electrode of the plurality of dummy electrodes made of the same metal material as the plurality of inner electrodes.

5. A capacitor according to claims 1,
wherein each dummy electrode of the plurality of dummy electrode has a thickness at least equal to that of the plurality of inner electrodes.

6. A capacitor according to claim 1,
wherein the capacitor further includes a third dielectric laminated portion disposed between the first dielectric laminated portions and having a laminated structure in which a plurality of third dielectric layers and a plurality of third land-shaped conductors connected to a peripheral portion of each of the plurality of capacitor via conductors are alternately laminated.

7. A capacitor according to claim 6,
wherein the third dielectric layer has a thickness greater than that of the first dielectric layer.

8. A capacitor according to claim 6,
wherein the third dielectric layer has a thickness equal to that of the first dielectric layer.

9. A capacitor according to claim 6,
wherein the second land-shaped conductors and the third land-shaped conductors are made of the same metal material as that of the plurality of inner electrodes.

10. A capacitor according to claim 6,
wherein the second land-shaped conductor and the third land-shaped conductor each have a thickness at least equal to that of the plurality of inner electrodes.

11. A capacitor according to claim 1,
wherein the capacitor further includes a fourth dielectric laminated portion disposed between the first and second dielectric laminated portions and having a plurality of land-shaped conductors connected to a peripheral portion of each of the plurality of capacitor via conductors.

12. A wiring board, said wiring board including the capacitor according to claim 1, wherein the capacitor is built in the wiring board.

13. A wiring board, said wiring board including a substrate main surface on which the capacitor according to claim 1 is surface-mounted using a flip-chip method.

14. A wiring board according to claim 13,
wherein a gap between the substrate main surface and the capacitor is sealed with a resin material.

15. A capacitor comprising:
a plate-like capacitor main body having a thickness direction and including a capacitor main surface and a capacitor rear surface;
a plurality of capacitor via conductors provided in the capacitor main body and extending in the thickness direction of the capacitor main body, the plurality of capacitor via conductors including power supplying via conductors and grounding via conductors; and
a plurality of terminal electrodes disposed on the capacitor main surface and connected to at least a capacitor main surface side end portion of the plurality of capacitor via conductors,
wherein the capacitor main body is comprised of:
a first dielectric laminated portion having a laminated structure including:
a plurality of first dielectric layers; and
a plurality of inner electrodes including power supplying inner electrodes and grounding inner electrodes which are alternately laminated by sandwiching the first dielectric layers, the power supplying inner electrodes connected only to the power supplying via conductors, the power supplying via conductors penetrating each of the power supplying inner electrodes so that the power supplying inner electrodes are electrically connected to each other, the grounding inner electrodes connected only to the grounding via conductors, the grounding via conductors penetrating each of the grounding inner electrodes so that the grounding inner electrodes are electrically connected to each other; and
a second dielectric laminated portion without any inner electrodes, and formed so as to be exposed at a surface of the capacitor main body, said second dielectric laminated portion having a laminated structure including:
a plurality of second dielectric layers;
a plurality of dummy electrodes unconnected to the peripheral portion of the plurality of capacitor via conductors, alternately laminated; and
a plurality of second, land-shaped conductors connected to the peripheral portion of each of the plurality of capacitor via conductors and formed in the plurality of second dielectric layers in common with an associated dummy electrode.

16. A capacitor according to claim 15, wherein each dummy electrode is of a solid configuration and formed around an associated capacitor via conductor with a clearance therebetween.

17. A capacitor comprising:
a plate-like capacitor main body having a thickness direction and including a capacitor main surface and a capacitor rear surface; and
a plurality of capacitor via conductors provided in the capacitor main body and extending in the thickness direction of the capacitor main body, the plurality of capacitor via conductors including power supplying via conductors and grounding via conductors,
wherein the capacitor main body is comprised of:
a first dielectric laminated portion having a laminated structure including:
a plurality of first dielectric layers; and
a plurality of inner electrodes including power supplying inner electrodes and grounding inner electrodes which are alternately laminated by sandwiching the first dielectric layers, the power supplying inner electrodes connected only to the power supplying via conductors, the power supplying via conductors penetrating each of the power supplying inner electrodes so that the power supplying inner electrodes are electrically connected to each other, the grounding inner electrodes connected only to the grounding via conductors, the grounding via conductors penetrating each of the grounding inner electrodes so that the grounding inner electrodes are electrically connected to each other;

a second dielectric laminated portion having a laminated structure in which a plurality of second dielectric layers and a plurality of dummy electrodes unconnected to the peripheral portion of the plurality of capacitor via conductors are alternately laminated, and are disposed so as to be exposed at a surface portion of the capacitor main body; and a third dielectric laminated portion disposed between the first dielectric laminated portions and having a laminated structure in which a plurality of third dielectric layers and a plurality of third land-shaped conductors connected to a peripheral portion of each of the plurality of capacitor via conductors are alternately laminated.

* * * * *